(12) United States Patent
Kudo et al.

(10) Patent No.: US 7,679,144 B2
(45) Date of Patent: Mar. 16, 2010

(54) SEMICONDUCTOR DEVICE AND METHOD FOR MANUFACTURING THE SAME

(75) Inventors: Hiroshi Kudo, Kawasaki (JP); Kenji Ishikawa, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 183 days.

(21) Appl. No.: 11/938,441

(22) Filed: Nov. 12, 2007

(65) Prior Publication Data
US 2008/0061445 A1 Mar. 13, 2008

Related U.S. Application Data

(63) Continuation of application No. PCT/JP2005/008642, filed on May 11, 2005.

(51) Int. Cl.
*H01L 27/088* (2006.01)
*H01L 21/00* (2006.01)
*H01L 21/84* (2006.01)

(52) U.S. Cl. .................. 257/393; 257/381; 257/E21.59; 438/152

(58) Field of Classification Search .................. 257/393, 257/381, 383, 354, 385, 390; 438/152
See application file for complete search history.

(56) References Cited

U.S. PATENT DOCUMENTS

| | | | |
|---|---|---|---|
| 6,015,996 | A | 1/2000 | Lee |
| 6,347,062 | B2 | 2/2002 | Nii et al. |
| 6,525,382 | B1 | 2/2003 | Ishida |
| 6,535,453 | B2 | 3/2003 | Nii et al. |
| 6,714,439 | B2 | 3/2004 | Kobayashi et al. |
| 2002/0030236 | A1 | 3/2002 | Oyamatsu |
| 2004/0029327 | A1 | 2/2004 | Oyamatsu |

FOREIGN PATENT DOCUMENTS

| | | | |
|---|---|---|---|
| JP | 10173073 | A | 6/1998 |
| JP | 2000124332 | A | 4/2000 |
| JP | 200135938 | A | 2/2001 |
| JP | 2001332634 | A | 11/2001 |
| JP | 200243441 | A | 2/2002 |
| JP | 2002353340 | A | 12/2002 |
| JP | 2003179166 | A1 | 6/2003 |

OTHER PUBLICATIONS

International Search Report of PCT/JP2005/008642, date of mailing Aug. 23, 2005.

*Primary Examiner*—Walter L Lindsay, Jr.
(74) *Attorney, Agent, or Firm*—Westerman, Hattori, Daniels & Adrian, LLP

(57) ABSTRACT

The semiconductor device includes a silicon substrate, a device isolation insulating film dividing an active region of the silicon substrate into plural pieces, a gate electrode formed on the active region, a source/drain region which is formed in the active region on both sides of the gate electrode, and which constitutes a MOS transistor of an SRAM memory cell with the gate electrode, an interlayer insulating film formed over each of the active region and the device isolation insulating film, a first hole which is formed in the interlayer isolation insulating film, and which commonly overlaps with two adjacent active regions and the device isolation insulating film between the active regions, and a first conductive plug which is formed in the first hole, and which electrically connects the two active regions.

14 Claims, 41 Drawing Sheets o : concentration of impurities (phosphorus) in the source/drain region 36
▲ : concentration of impurities (boron) in the p-type channel region 24 of the prior art
● : concentration of impurities (boron) in the p-type channel region 24 of the first embodiment second example third example

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/008642, filed May 11, 2005, the entire contents of which are incorporated herein by reference.

BACKGROUND

1. Field

The embodiments discussed herein are directed to a semiconductor device and a method for manufacturing the same.

2. Description of the Related Art

Recently, the market size of large-scale integration (LSI) for mobile devices has been rapidly expanding as the demand for mobile devices such as cellular phones increases. Most of the mobile devices are battery-driven, so that there is a limitation on long term use of the mobile devices. Accordingly, not only higher operation but also lower power consumption are desired for the semiconductor devices such as the above-described LSI.

There are various types of semiconductor devices to be mounted on such mobile devices. In particular, an SRAM (static random access memory) can be operated at a higher speed than other memory devices, and thereby widely used for system memories of mobile devices and the like. An SRAM is classified into a six-transistor-type, a three-transistor-type, and the like, according to a structure of a cell. Among these types, FIG. 1 shows an equivalent circuit of one cell of a six-transistor-type SRAM.

As shown in FIG. 1, this type of SRAM includes transfer transistors $TR_{T1}$, and $TR_{T2}$ and driver transistors $TR_{D1}$ and $TR_{D2}$, all of which are n-type MOS (metal oxide semiconductor) transistors. Furthermore, in addition to these transistors, two load transistors $TR_{L1}$, and $TR_{L2}$, which are p-type MOs transistors, are connected as shown in the figure, so that one cell of SRAM is made, which is driven between a power voltage VDD and a ground potential GND.

FIG. 2 is a plan view of this SRAM.

As shown in FIG. 2, this SRAM includes a silicon substrate 1 on which active regions 4 for the n-type MOS transistors and active regions 5 for p-type MOS transistors are formed, and further includes gate electrodes 2 formed on these active regions 4 and 5 with a gate insulating film interposed therebetween (not shown). Then, a plurality of conductive plugs 3 are formed on the active regions 4 and 5 and the gate electrodes 2 so as to obtain the equivalent circuit of FIG. 1 by electrically connecting them with a metal wiring which is not shown in the figure.

FIG. 3 is a view enabling a plan layout of the active regions 4 and 5 to be easily viewed by omitting the above-described gate electrodes 2 and conductive plugs 3.

As shown in the figure, the active regions 4 for the n-type MOS transistors are defined by first openings 6a of device isolation insulating films 6 formed on the silicon substrate 1. In addition, the active regions 5 for p-type MOS transistors are defined by second openings 6b of the device isolation insulating films 6.

Various plan layouts for the active regions 4 and 5 have been invented. In the example of FIG. 3, to cause an active region 4 for the n-type MOS transistor to be shared by plural cells, a plan layout thereof is stripe-shaped. Such an SRAM is referred to as a stripe-shaped SRAM, which was popularly adopted at the early period when the SRAM was available on the market. It was once considered that the stripe-shaped SRAM was not suitable for higher integration. However, it has been found out recently that this type of SRAM is rather advantageous in higher integration, so that attention has been given on the stripe-shaped SRAM again.

In contrast, FIG. 4 is a plan view of SRAM referred to as a bent-shaped type. The same reference numerals are given to the components described in FIG. 2. FIG. 5 is a view enabling a plan view of the active regions 4 and 5 to be easily viewed by omitting the gate electrodes 2 of FIG. 4.

As shown in FIG. 5, each of the active regions 4 for the n-type MOS transistors is shared by two upper and lower cells and is bent in each cell to be loop-shaped. Each of the active regions 4 for n-type transistors is bent, so that a cell size can be made smaller, thereby higher integration of SRAM can be made.

Note that technologies relating to the present application have been also disclosed in patent literatures 3 to 5.

Patent literature 1: Japanese Patent Application Laid-open Publication No. 2003-179166

Patent literature 2: Japanese Patent Application Laid-open Publication No. 2001-332634

Patent literature 3: Japanese Patent Application Laid-open Publication No. Hei 10-173073

Patent literature 4: Japanese Patent Application Laid-open Publication No. 2002-43441

Patent literature 5: Japanese Patent Application Laid-open Publication No. 2002-353340

SUMMARY

It is an aspect of the embodiments discussed herein to provide a semiconductor device including a semiconductor substrate, a device isolation insulating film dividing an active region of the semiconductor substrate into plural pieces, a gate electrode formed on the active region with a gate insulating film interposed therebetween, a source/drain region which is formed in the active region on both sides of the gate electrode, and which constitutes a MOS transistor of a memory cell with the gate electrode, an interlayer insulating film formed over each of the active region and the device isolation insulating film, a hole which is formed in the interlayer insulating film, and which commonly overlaps with two adjacent active regions and the device isolation insulting film between the two active regions, and a conductive plug which is formed in the hole, and which electrically connects the two active regions.

DETAILED DESCRIPTION OF THE PREFERRED EMBODIMENTS

A bent-shaped SRAM as described above is also disclosed in FIG. 7 of patent literature 1.

Figure 3:
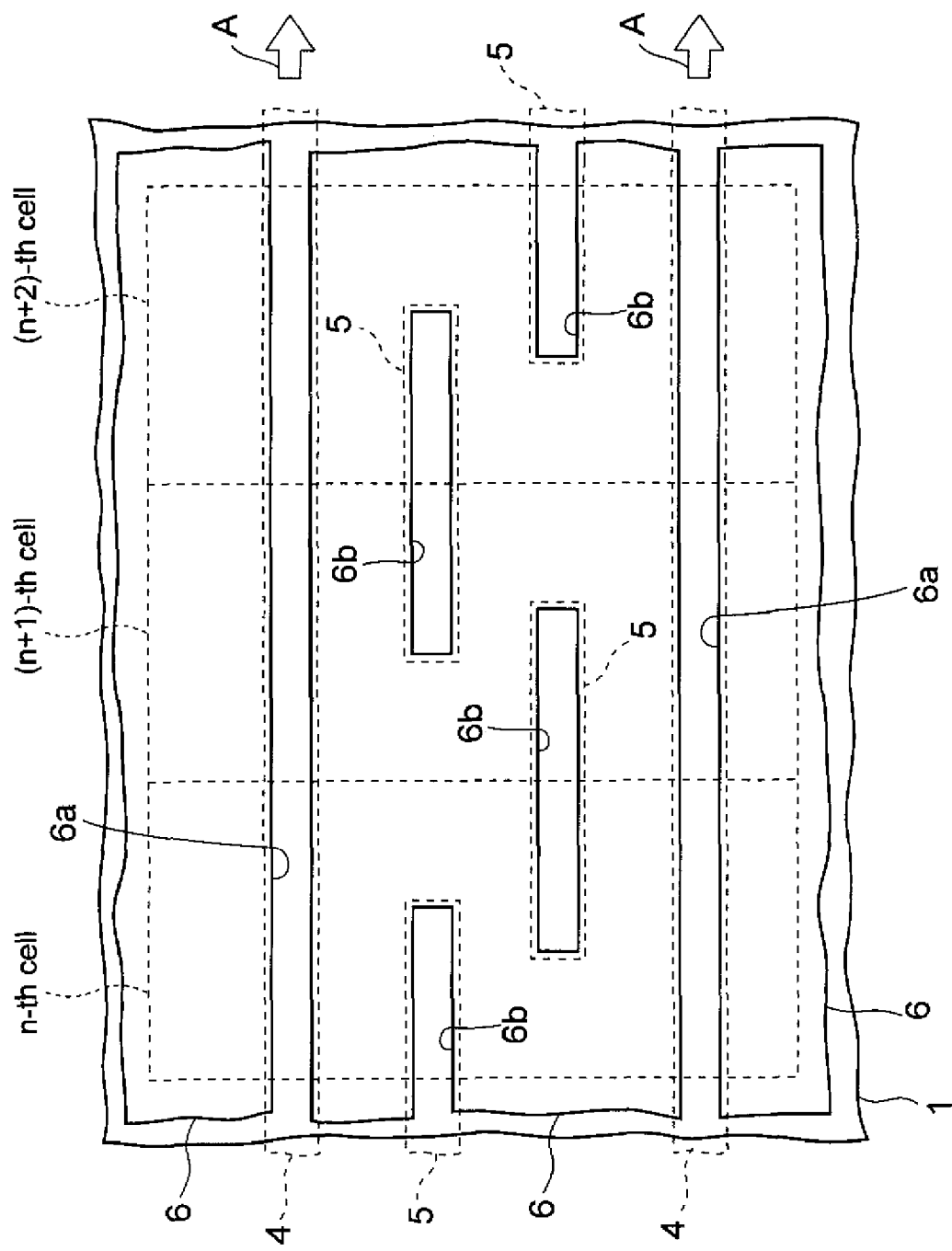
FIG. 3 is a plan view of FIG. 2, in which a gate electrode and a conductive plug are omitted.

And now, in the stripe-shaped SRAM shown in FIG. 3, the active regions 4 for the n-type MOS transistors are shared by all the cells in a lateral direction in the figure, and a total length in a longitudinal direction thereof becomes extremely long, for example, 50 μm or more. If the active regions 4 are long like this, the silicon substrate 1 of the active regions 4 receives a large stress due to a difference in stresses of the device isolation insulating film 6 and the silicon substrate 1. Then, in an extreme case, the silicon substrate 1 relatively moves in relation to the device isolation insulating film 6 in a direction shown by arrows A of FIG. 3.

However, when such a stress is caused, a thermal diffusion coefficient of impurities introduced into the active regions 4 of the silicon substrate 1 increases. Accordingly, the above-mentioned n-type impurities widely diffuse compared with a case without the stress, for example, at the time of activation annealing to the n-type impurities for an n-type source/drain region. As a result, in a driver transistor $TR_{D1}$ (see, FIG. 2) using part of the active region 4 as a source/drain region, an interval between the source/drain regions becomes shorter under the gate electrode 2. In this case, even when the driver transistor $TR_{D1}$ is turned off and is in a stand-by state, a leak current, referred to as a sub-threshold leak, flows between the source and the drain, and which results in increase of consumption power of the driver transistor $TR_{D1}$ in a stand-by state.

In addition, a problem similar to the above also occurs in a transfer transistor $TR_{T1}$ using part of an active region 4 as a source/drain region.

The thermal diffusion coefficient of boron is larger than those of other impurities. Accordingly, in the case where boron (B) is used as p-type impurities to be implanted into a channel region of the n-type MOS transistor, the thermal diffusion coefficient thereof becomes larger due to the above-described stress. Thus, it is difficult to form a channel region with a targeted impurity concentration profile.

Figure 5:
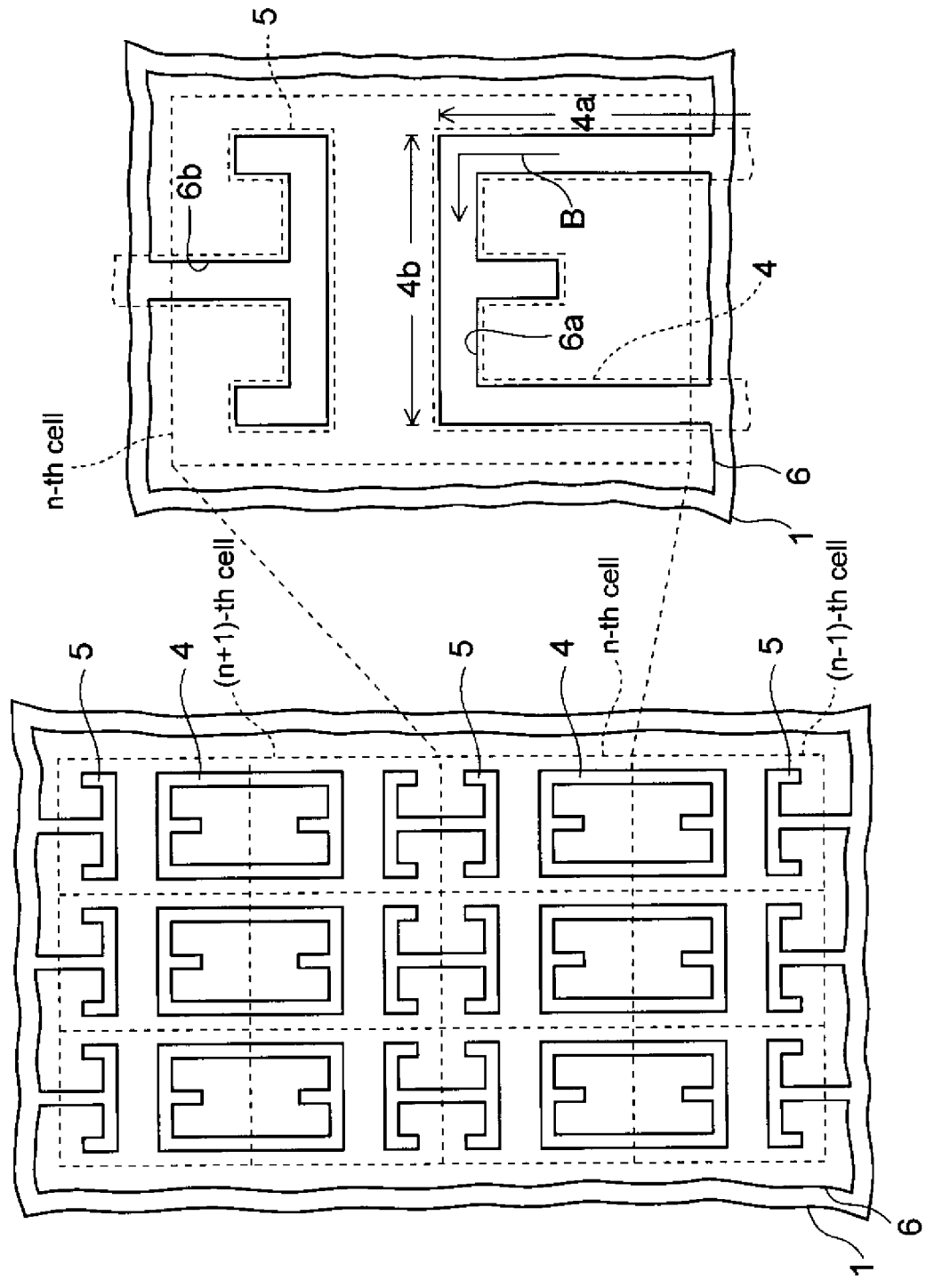
FIG. 5 is a plan view of FIG. 4, in which a gate electrode is omitted.

In contrast, in the bent-shaped SRAM shown in FIG. 5, since a length of the active region 4 for the n-type MOS transistor is shorter than that of the above-described stripe-shaped SRAM, the stress is seemingly hard to be added on the silicon substrate 1.

However, even in the bent-shaped SRAM, in the active region 4, a stress is also caused in a direction shown by an arrow B in a first portion 4a extending across two cells, and the stress is added on a second portion 4b to be a source/drain of a transistor. Accordingly, similar to the case of the stripe-shaped SRAM, problem occurs in which a leak current increases in a stand-by state.

Meanwhile, in the stripe-shaped and bent-shaped SRAMs, six MOS transistors are formed in on cell. One example of a cross-section thereof, for example, can be shown in FIG. 6.

Figure 2:
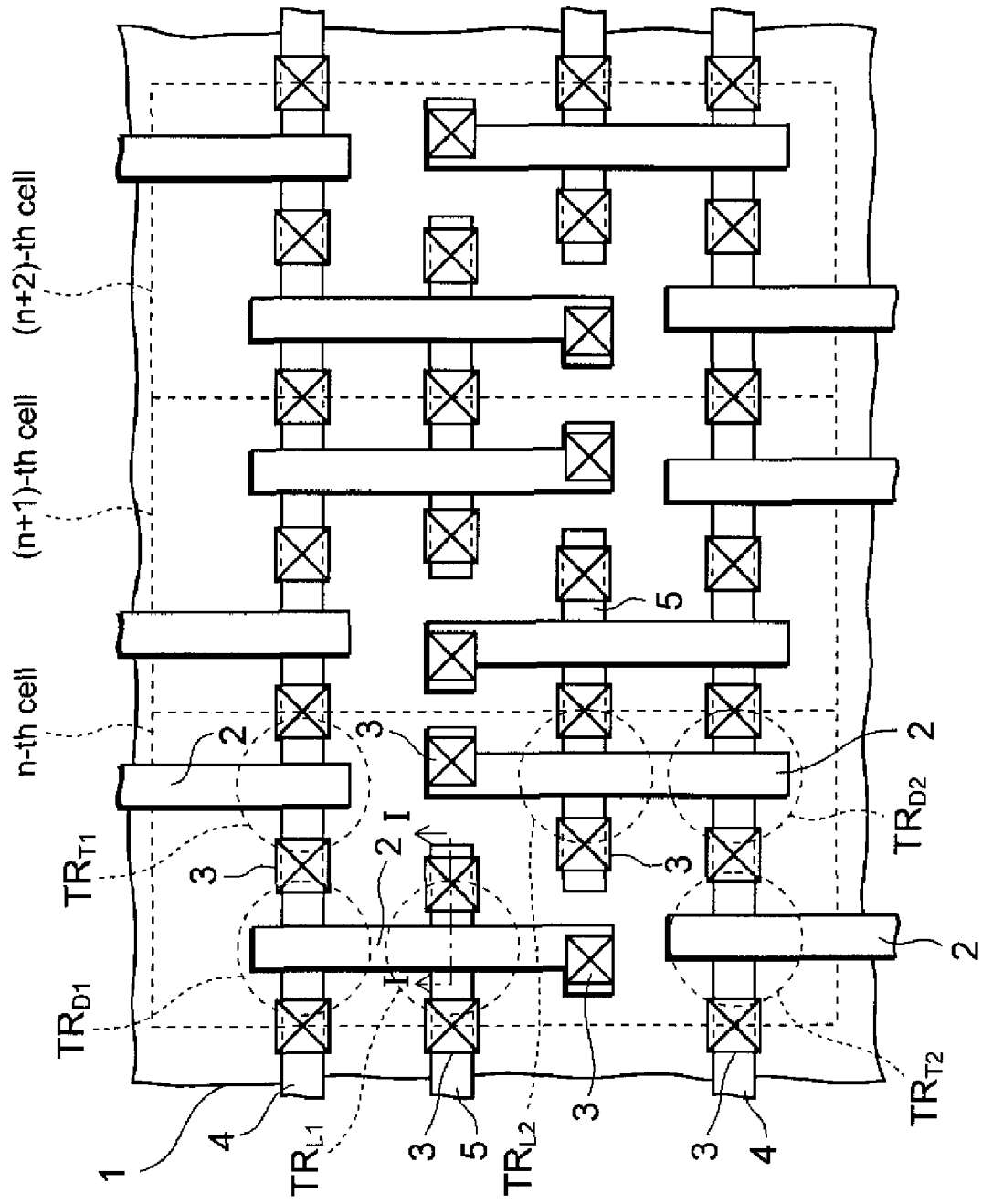
FIG. 2 is a plan view of a stripe-shaped SRAM according to a conventional embodiment.
Figure 6:
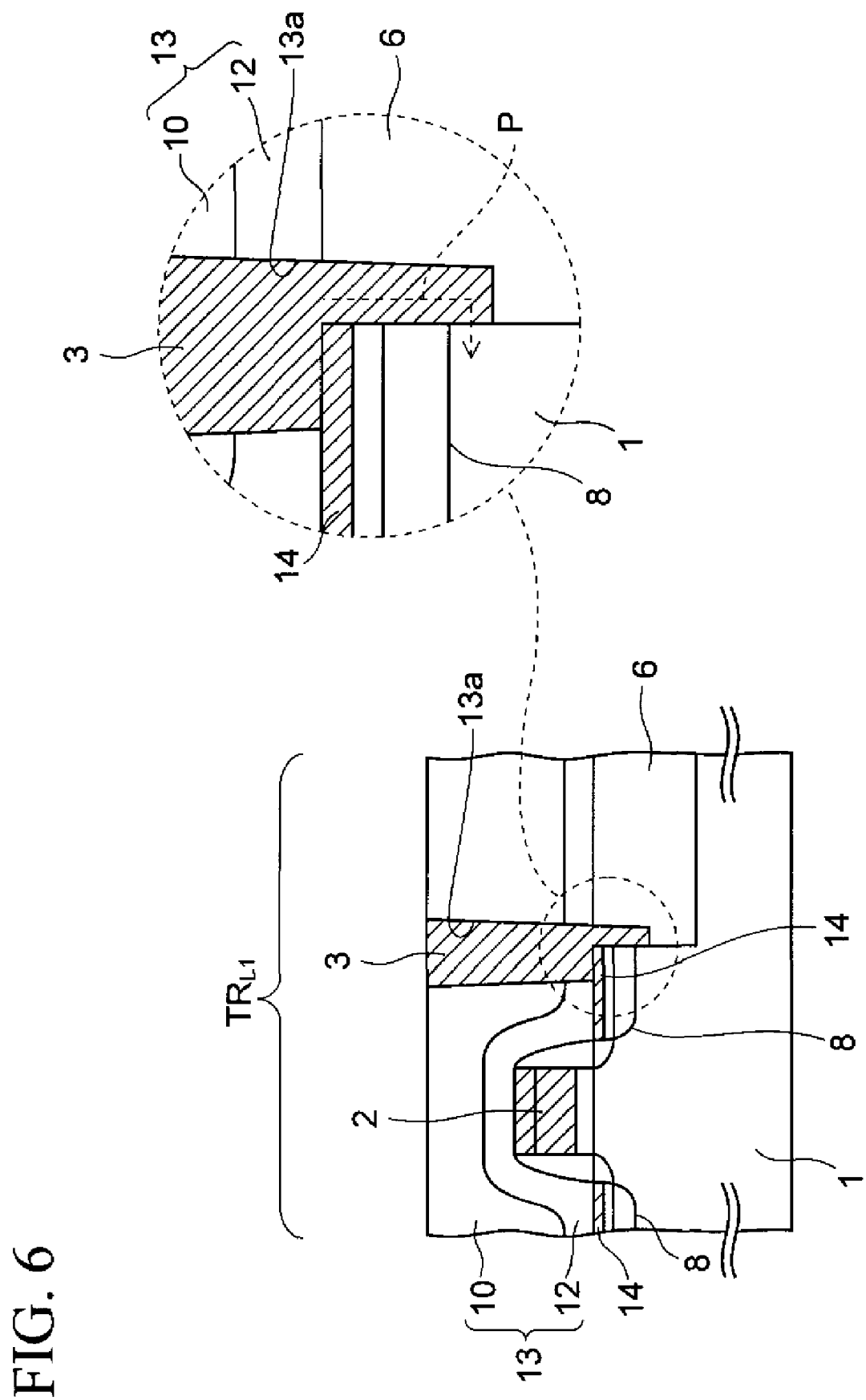
FIG. 6 is a cross-sectional view taken along the I-I line in FIG. 2.

FIG. 6 is a cross-sectional view of the load transistor $TR_{L1}$, which corresponds to a cross-sectional view taken along the I-I line in FIG. 2. Note that the transfer transistor and the load transistor also have cross-sectional structures similar to that of FIG. 6.

As shown in FIG. 6, the transistor $TR_{L1}$ has a source/drain region 8 in the silicon substrate 1 on both sides of the gate electrode 2, and a refractory metal silicide layer 14 is further formed on a surface layer of the source/drain region 8. Then, a silicon nitride film 12 and a silicon oxide film 10 are formed in this order so as to cover the gate electrode 2, and an interlayer insulating film 13 is configured thereby.

The interlayer insulating film 13 has a contact hole 13a above the source/drain region 8, and a conductive plug 3 to be electrically connected to the source/drain region 8 is formed in the contact hole 13a.

The contact hole 13a is formed by patterning the interlayer insulating film 13 by photolithography. If a resist pattern to be a mask for etching is precisely aligned with the silicon substrate 1 in the photolithography, the contact hole 13a is positioned above the source/drain region 8 as designed.

However, if the positions of the resist pattern and silicon substrate 1 are misaligned at the time of the photolithography, as shown in a dotted circle in FIG. 6, part of the contact hole 13a moves away from the source/drain region 8 to overlap with the device isolation insulating film 6. Since the contact hole 13a is normally formed by etching deeper than a depth thereof to prevent the contact hole 13a from being unopened. Accordingly, if the contact hole 13a overlaps with the device isolation insulating film 6 as described above, the device isolation insulating film 6 under the contact hole 13a is also removed by the etching.

However, if the device isolation insulating film 6 is removed deeper than the junction depth of the source/drain region 8, the conductive plug 3 comes in direct contact with the silicon substrate 1, and a leak path P passing from the conductive plug 3 to the silicon substrate 1 as shown in the figure is formed.

The leak path P becomes a reason for causing a leak current in a transistor in a stand-by state, and which results in increase of power consumption of the transistor.

One of the methods to avoid such an inconvenience is disclosed, for example, in FIG. 1(a) of patent literature 2. In this method, ions are implanted into a boundary portion between an active region of transistor for the SRAM and a device isolation insulating film when a LDD (lightly doped drain) of a transistor for input/output circuit is ion-implanted, so that the junction depth of the source/drain region is set to be deeper. According to this, even if the position of the contact hole 13a is misaligned as shown in FIG. 6, since the source/drain region 8 is formed deeper than a bottom edge of the conductive plug 8, the above-described leak path P is not formed.

And now, when an LLD is formed by ion implantation, a resist pattern for selectively ion-implanting impurities into a boundary portion between an active region for transistor for the SRAM and a device isolation insulating film is required.

The resist pattern does not particularly cause a problem as long as it is correctly aligned with the silicon substrate 1. However, it is a rare case where a resist pattern is correctly aligned with a silicon substrate in photolithography, and misalignment normally occurs for some extent.

Figure 7:
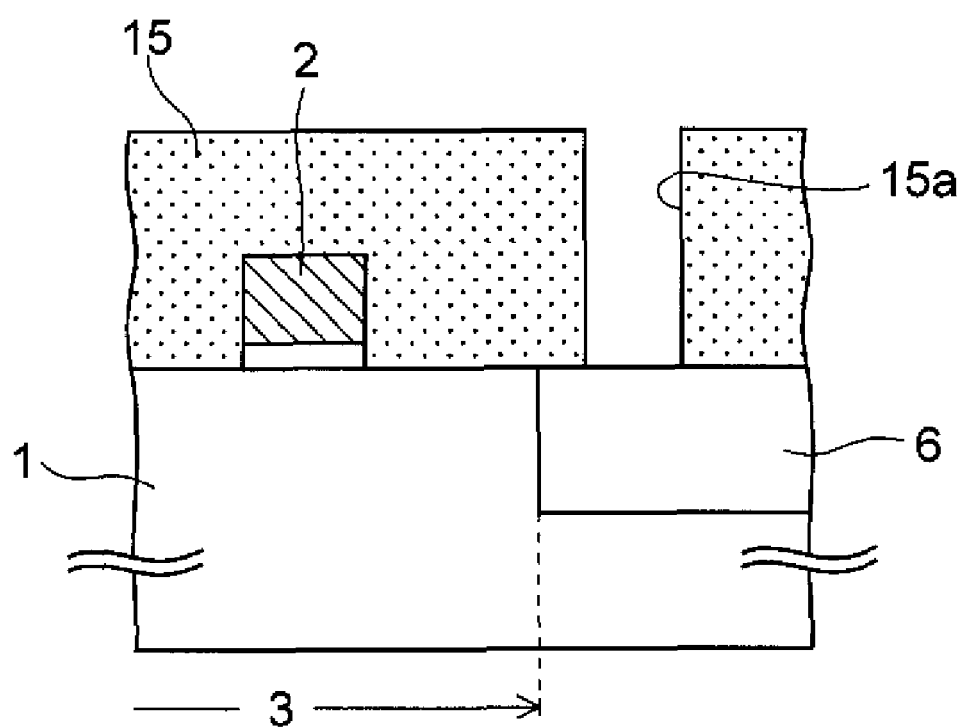
FIG. 7 is a cross-sectional view for describing a problem in a method disclosed in patent literature 2.

FIG. 7 is a cross-sectional view showing the case where large misalignment occurs in a resist pattern 15 which is used when ion-implanting an LDD by the method disclosed in patent literature 2.

As shown in FIG. 7, a window 15a is formed in the resist pattern 15. The window 15a is originally a window for introducing impurities into the boundary portion between the active region 3 and the device isolation insulating film 6. However, in the example of FIG. 7, the window 15a is largely misaligned to a side of the device isolation insulating film 6. Accordingly, it is impossible to introduce the impurities into the active region 3 through the window 15a. Consequently, in the method proposed in patent literature 2, in the case where large misalignment occurs in the resist pattern 15, a leak current under the contact hole 13a cannot be reduced.

(1) First Embodiment

FIGS. 8 to 21 are cross-sectional views showing a semiconductor device in the process of manufacturing according to a first embodiment. The semiconductor device is a stripe-shaped SRAM. In the above-described FIGS. 8 to 21, cross-sectional views of an n-th cell and an adjacent (n+1)-th cell are shown. Moreover, an n-type MOS transistor forming region A and a p-type MOS transistor forming region B in each cell are separately depicted in one above the other. In addition, FIGS. 22 to 25 are plan views thereof.

Firstly, steps for obtaining a cross-sectional structure shown in FIG. 8 will be described.

First, device isolation grooves 20a are formed in a silicon (semiconductor) substrate 20 by photolithography, thereafter a silicon oxide film is formed in the device isolation grooves 20a by a CVD (chemical vapor deposition) method, so that the device isolation grooves 20a are completely embedded with the silicon oxide film. Next, the excess silicon oxide film which is on the semiconductor substrate 20 is polished to remove by a CMP (chemical mechanical polishing) method so as to leave it in the device isolation grooves 20a as device isolation insulating films 21. Such a device isolation structure is also referred to as a STI (shallow trench isolation). Note that the device isolation structure of the present embodiment is not limited to the STI, but a LOCOS (local oxidation of silicon) may be adopted.

Thereafter, an exposed surface of the silicon substrate 20 is thermally oxidized to form a thermal oxidation film with a thickness of approximately, for example, 10 nm, and this film is used as sacrificial insulating films 26.

Then, while these sacrificial insulating films 26 are used as through films, boron (B) as p-type impurities are ion-implanted into the silicon substrate 20 of the n-type MOS transistor forming region A to form p-wells 22. As for conditions for the ion implantation, for example, adopted are acceleration energy of approximately 250 to 350 keV, a doze amount of approximately $1 \times 10^{13}$ to $5 \times 10^{13}$ cm$^{-2}$, and a tilt angle of 0°.

Furthermore, an n-well 23 is formed in the silicon substrate 20 of the p-type MOS transistor forming region B, by ion-implanting phosphorus (P) with the above-described sacrificial insulating films 26 used as through films, under conditions of, for example acceleration energy of approximately 550 to 750 keV, a doze amount of approximately $1 \times 10^{13}$ to $5 \times 10^{13}$ cm$^{-2}$, and a tilt angle of 0°.

During the ion implantation, the n-type impurities and the p-type impurities are separately implanted by using a resist pattern which is not shown.

Figure 22:
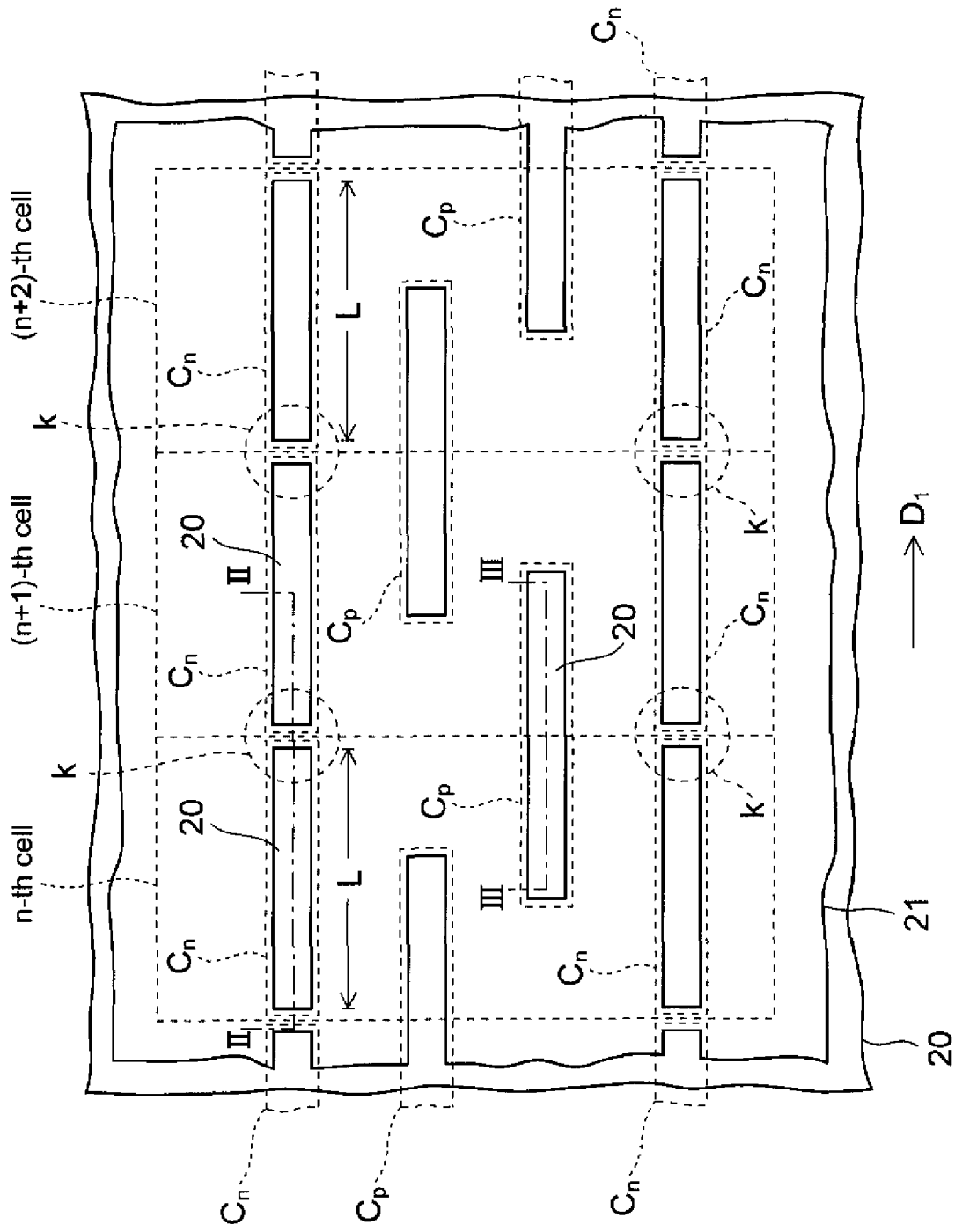
FIG. 22 is a plan view (No. 1) of the semiconductor device in the process of manufacturing according to the first embodiment.

FIG. 22 shows a plan layout of the devise isolation insulating film 21 formed as described above.

Figure 8:
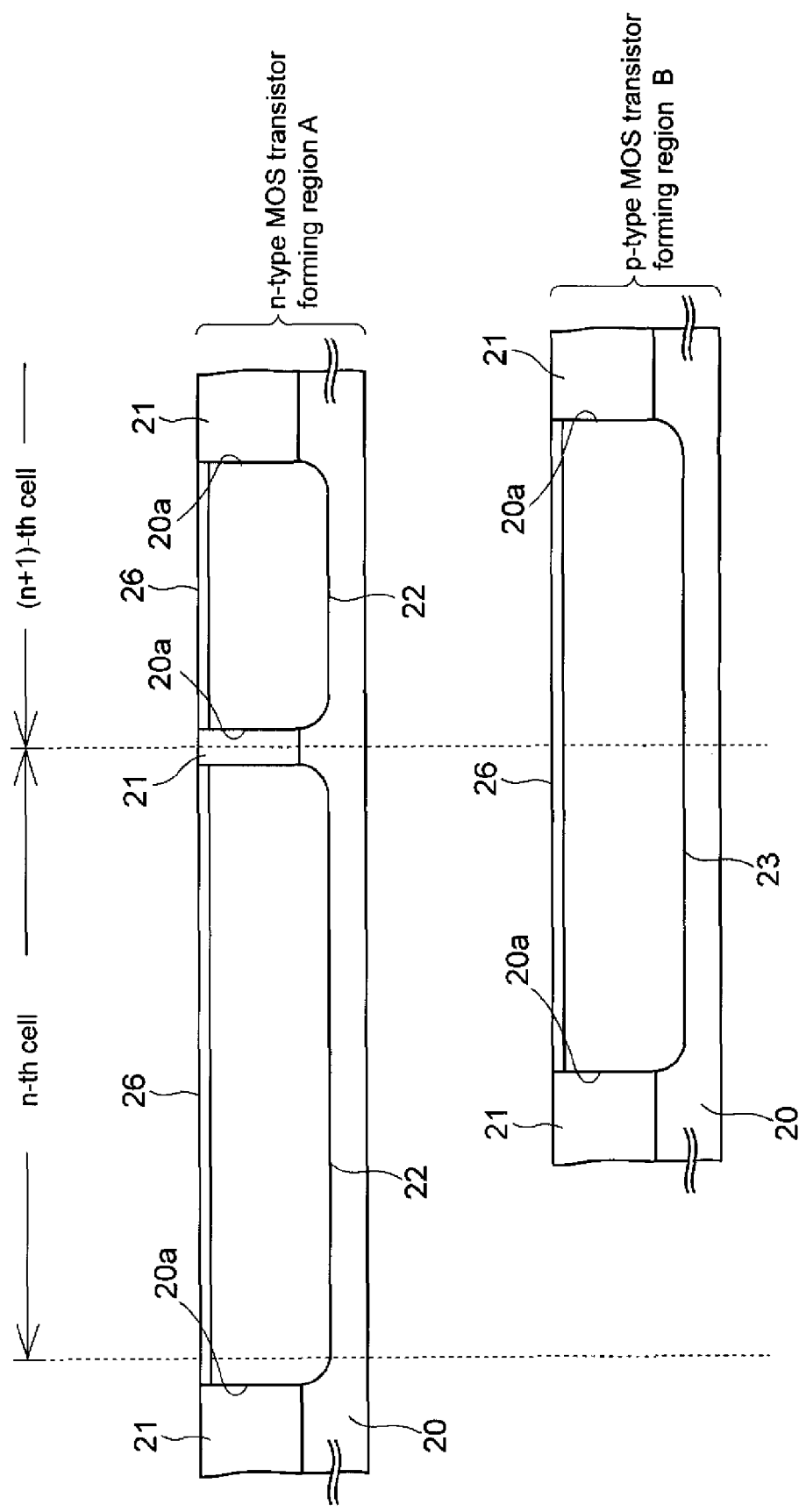
FIG. 8 is a cross-sectional view (No. 1) showing a semiconductor device in the process of manufacturing according to a first embodiment.

Note that in the above-described FIG. 8, the cross-sectional view of the n-type MOS transistor forming region A corresponds to a cross-sectional view taken along the II-II line in FIG. 22, and the cross-sectional view of the p-type MOS transistor forming region B corresponds to a cross-sectional view taken along the III-III line. In addition, the sacrificial insulating films 26 are omitted in FIG. 22.

In FIG. 22, the substrate 20 in a portion where a device isolation insulating film 21 is not formed serves as an n-type active region $C_n$ for the n-type MOS transistor and a p-type active region $C_p$ for p-type MOS transistor. Then, in the present embodiment, in portions shown by dotted circles K, the n-type active region $C_n$ is divided into plural pieces by the device isolation insulating film 21. In addition, the n-type active regions $C_n$ are arranged to form lines in a stripe shape in a longitudinal direction $D_1$ of the region $C_n$.

Figure 9:
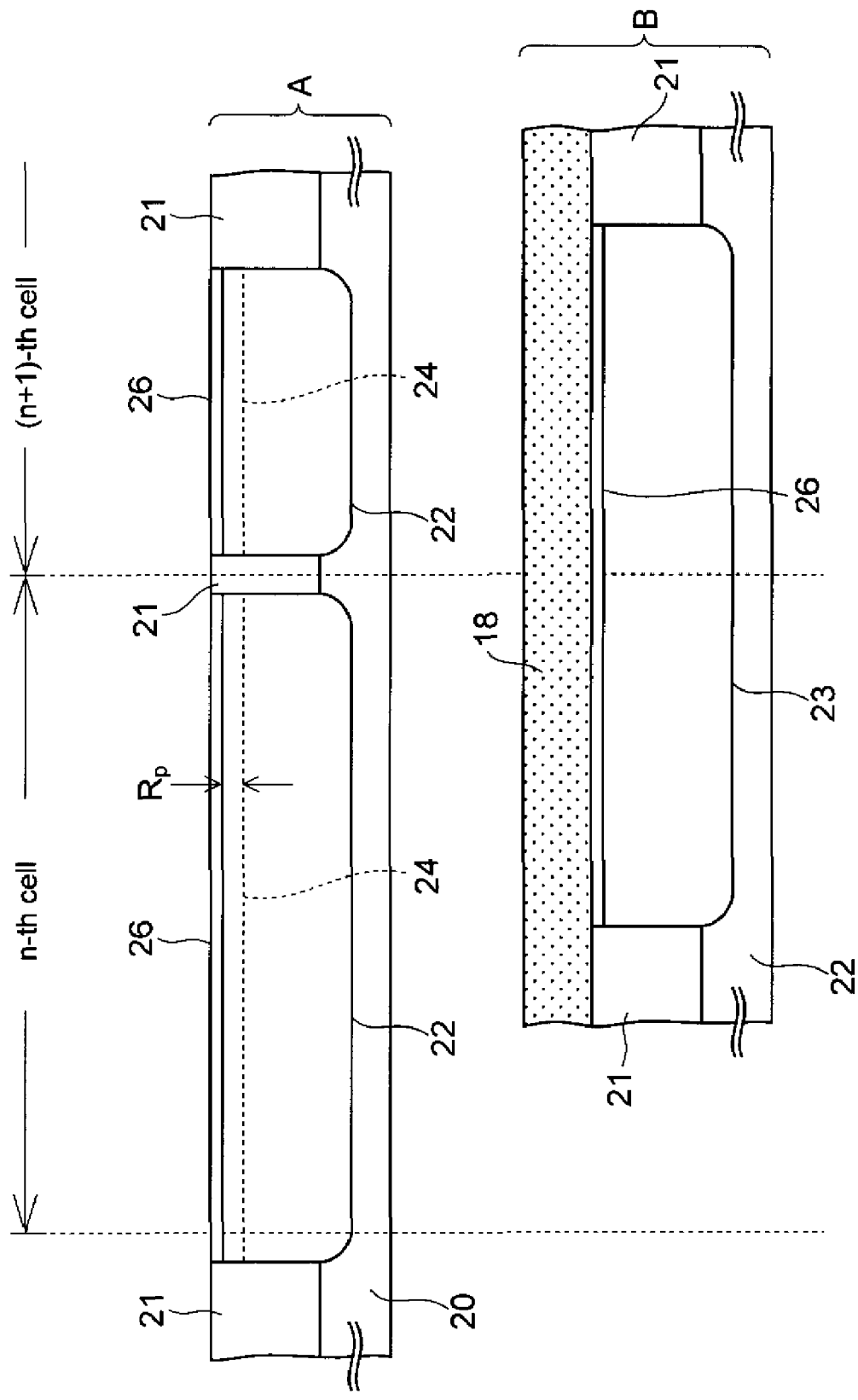
FIG. 9 is a cross-sectional view (No. 2) showing the semiconductor device according to the first embodiment.

Next, as shown in FIG. 9, a first resist pattern 18 covering the p-type MOS transistor forming region B is formed over the silicon substrate 20. After that, while the sacrificial insulating films 26 are used as through films, the p-type impurities are ion-implanted into the silicon substrate 20 of the n-type MOS transistor forming region A to form p-type channel regions 24.

It is preferable that the peak depth Rp of impurity concentration of the p-type channel regions 24 be as shallow as possible from a surface of the silicon substrate 20, and be formed in a position shallower than, for example, approximately 0.015 µm from the surface.

In addition, as the p-type impurities, any one of boron (B) and BF$_2$ is adopted. Note that boron has a smaller molecule size than that of BF$_2$, and thus has a small probability of colliding with silicon atoms at the time of the ion implantation. For this reason, among the ion-implanted boron atoms, some of the boron atoms are deeply implanted into the silicon substrate 20 than other atoms. Since such boron atoms act so as to lengthen a tail portion (channeling) of a concentration profile of boron, boron is prevented from selectively being introduced into the surface of the silicon substrate 20.

Such channeling can be prevented for some extent by carrying out the ion implantation through the sacrificial insulating films 26 as described above, and by scattering ions in the amorphous sacrificial insulating films 26 to deteriorate directivity of ions.

However, in order to suppress the channeling more effectively, it is preferable that BF$_2$ with an atom size and a mass larger than those of boron be adopted as p-type impurities. Since BF$_2$ has a higher probability of colliding with silicon atoms at the time of the ion implantation than baron, the above-described channeling can be reduced, and ions can be selectively implanted only into the surface of the silicon substrate 20. Note that when BF$_2$ is adopted, conditions for ion implantation are not particularly limited, but it is preferable to use conditions of, for example, acceleration energy of approximately 5 to 40 KeV, a doze amount of approximately $8 \times 10^{12}$ to $3 \times 10^{13}$ cm$^{-2}$, and a tilt angle of 7°. In addition, when the above-described channeling does not particularly cause a problem, and hence boron is adopted as p-type impurities, there may be adopted conditions of, for example, acceleration energy of approximately 5 to 30 KeV, a doze amount of approximately $8 \times 10^{12}$ to $3 \times 10^{13}$ cm$^{-2}$, and a tilt angle of 7°.

Figure 23:
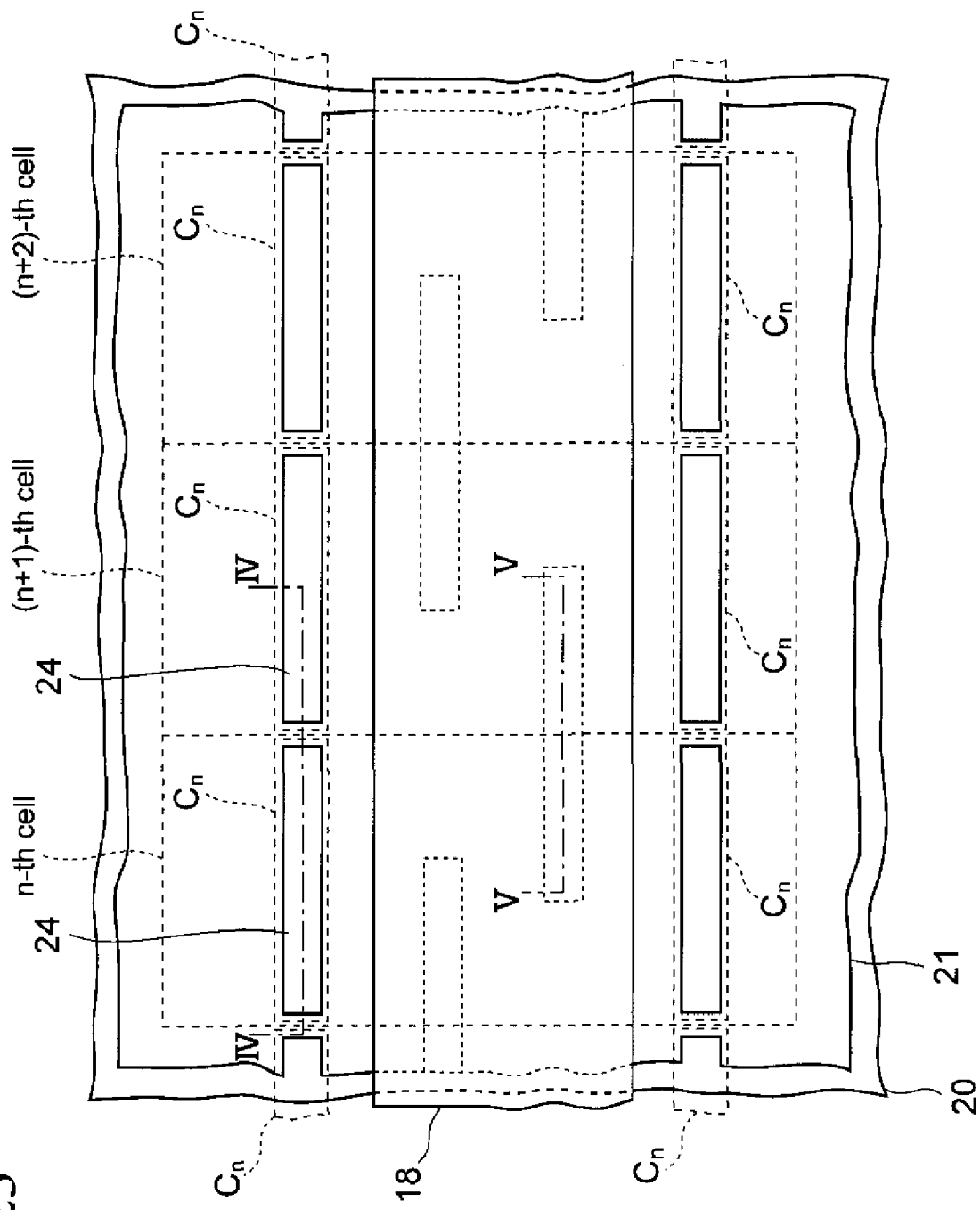
FIG. 23 is a plan view (No. 2) of the semiconductor device in the process of manufacturing according to the first embodiment.

Note that FIG. 23 is a plan view after this step is completed. The cross-sectional view of the n-type MOS transistor forming region A in FIG. 9 corresponds to a cross-sectional view taken along the IV-IV line in FIG. 23. The cross-sectional view of the p-type MOS transistor forming region B corresponds to a cross-sectional view taken along the V-V line in FIG. 23. However, in FIG. 23, sacrificial insulating films 26 are omitted.

After that, the first resist pattern 18 is removed.

Figure 10:
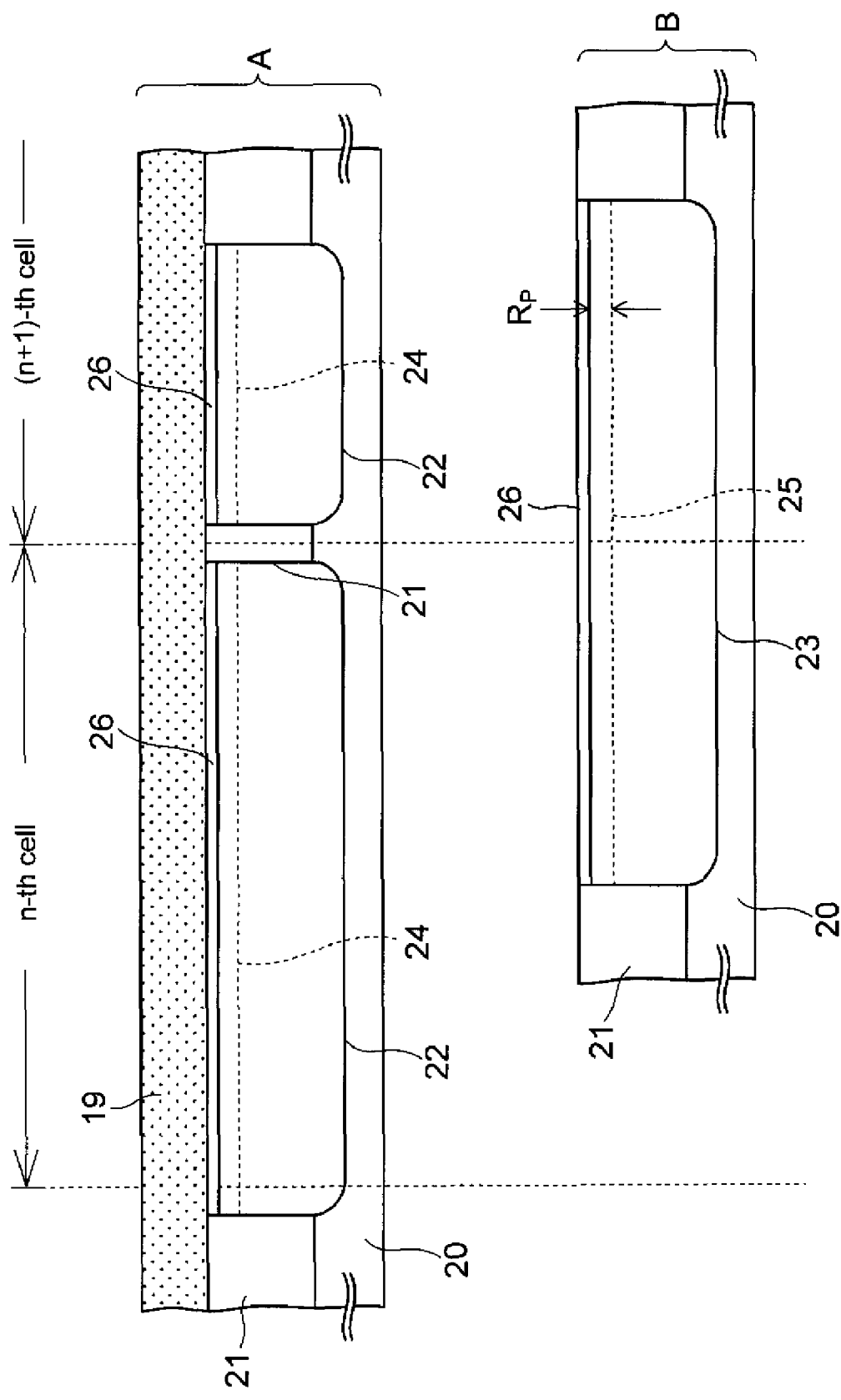
FIG. 10 is a cross-sectional view (No. 3) showing the semiconductor device in the process of manufacturing according to the first embodiment.

Next, as shown in FIG. 10, a second resist pattern 19 covering the n-type MOS transistor forming region A is formed over the silicon substrate 20. Then, this second resist pattern 19 is used as a mask, and the sacrificial insulating films 26 are used as through films, so that an n-type channel region 25 is formed by ion-implanting arsenic (As) as n-type impurities into the p-type MOS transistor forming region B. The conditions for this ion implantation are not particularly limited, but in the present embodiment, adopted are conditions of acceleration energy of approximately 30 to 60 keV, a doze amount of approximately $5 \times 10^{12}$ to $1 \times 10^{13}$ cm$^{-2}$, and a tilt angle of 7°. Note that phosphorus (P) may be ion-implanted instead of ion-implanting arsenic as described above.

In addition, similar to the above-described p-type channel regions 24, it is preferable that the peak depth Rp of impurity concentration of this n-type channel region 25 be formed as shallow as possible, for example, be shallower than approximately 0.015 µm.

Figure 24:
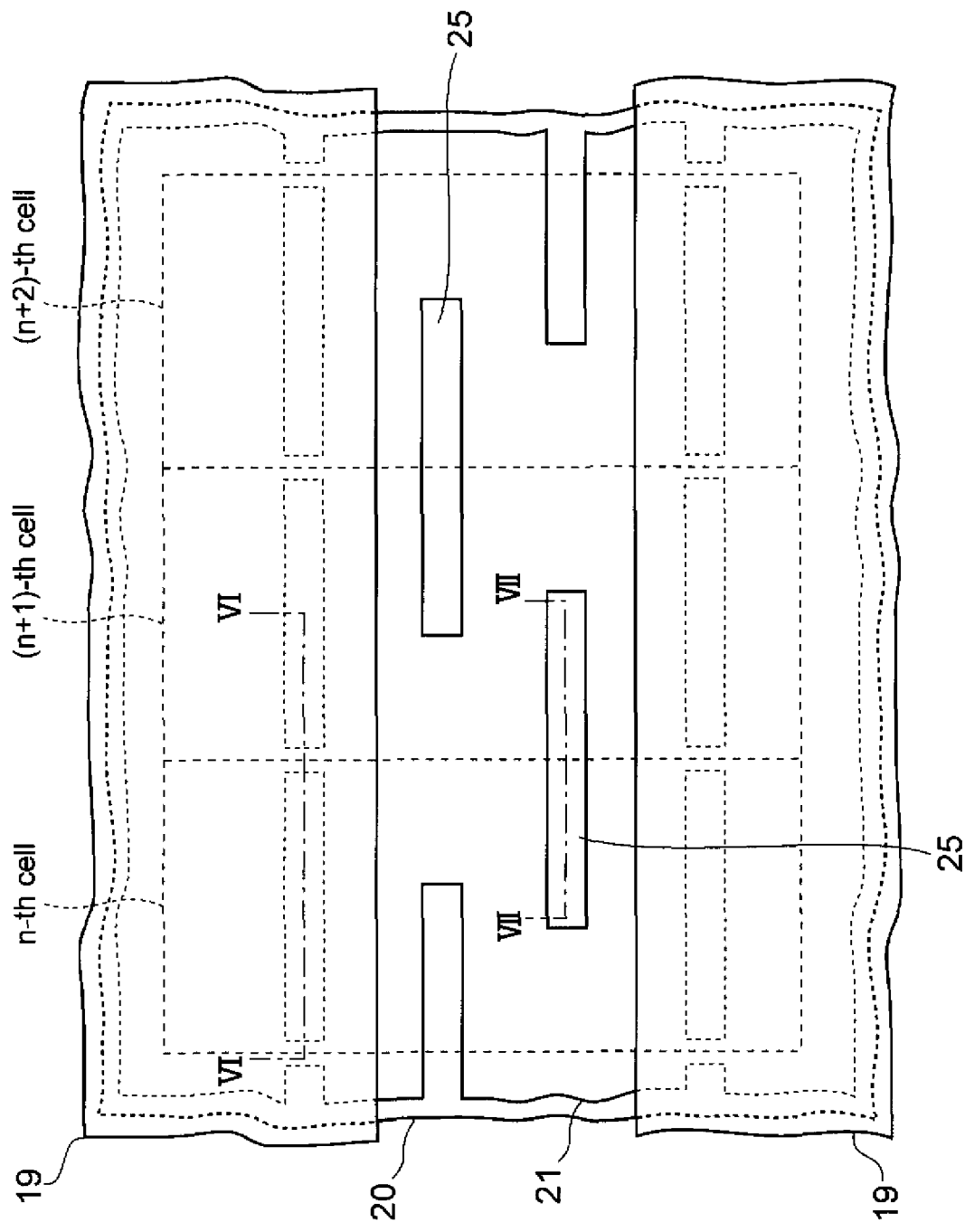
FIG. 24 is a plan view (No. 3) of the semiconductor device in the process of manufacturing according to the first embodiment.

FIG. 24 is a plan view after this step is completed. The cross-sectional view of the n-type MOS transistor forming region A of the above-described FIG. 10 corresponds to a cross-sectional view taken along the VI-VI line in FIG. 24. The cross-sectional view of the p-type MOS transistor forming region B corresponds to a cross-sectional view taken along the VII-VII line in FIG. 24. Note that the sacrificial insulating films 26 are omitted in FIG. 24.

After that, the second resist pattern 19 is removed.

Figure 11:
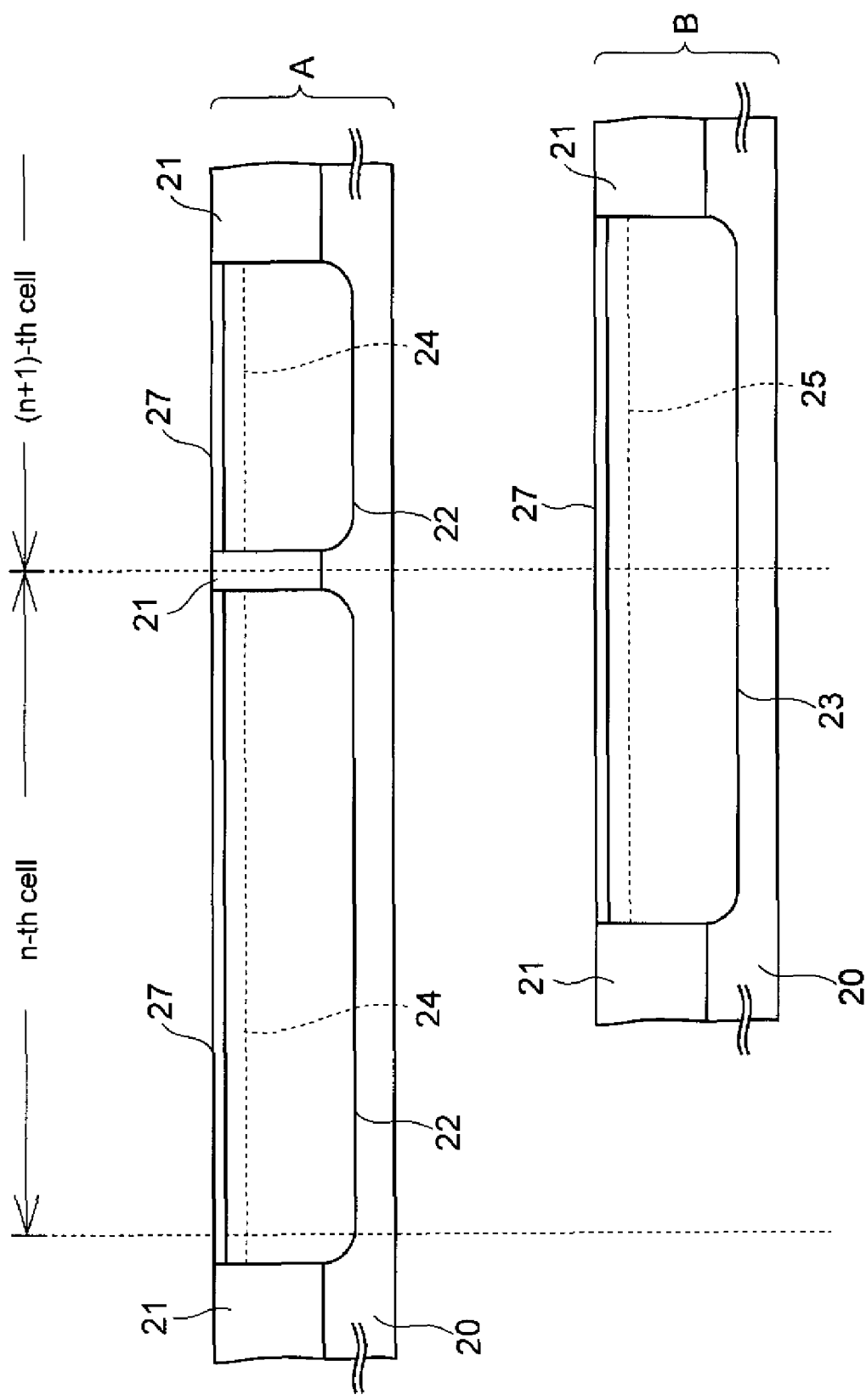
FIG. 11 is a cross-sectional view (No. 4) showing the semiconductor device in the process of manufacturing according to the first embodiment.

Next, steps for obtaining a cross-sectional structure shown in FIG. 11 will be described.

First, the above-described sacrificial insulating films 29 that are damaged by the ion implantation are wet-etched and removed by a hydrofluoric acid solution to expose cleaned surfaces of the silicon substrate 20. Then, the cleaned surfaces of the silicon substrate 20 are thermally oxidized to form thermal oxidation films with a thickness of, for example, approximately 1 to 3 nm, and these thermal oxidation films are used as gate insulating films 27.

Note that, as the gate insulating films 27, there may be formed high dielectric insulating films with a high dielectric constant higher than that of the above-described thermal oxidation film. The high dielectric insulating films include films such as an HfO film, an HfAlO film, an AlO film, and a film made by introducing nitride in these films.

Figure 12:
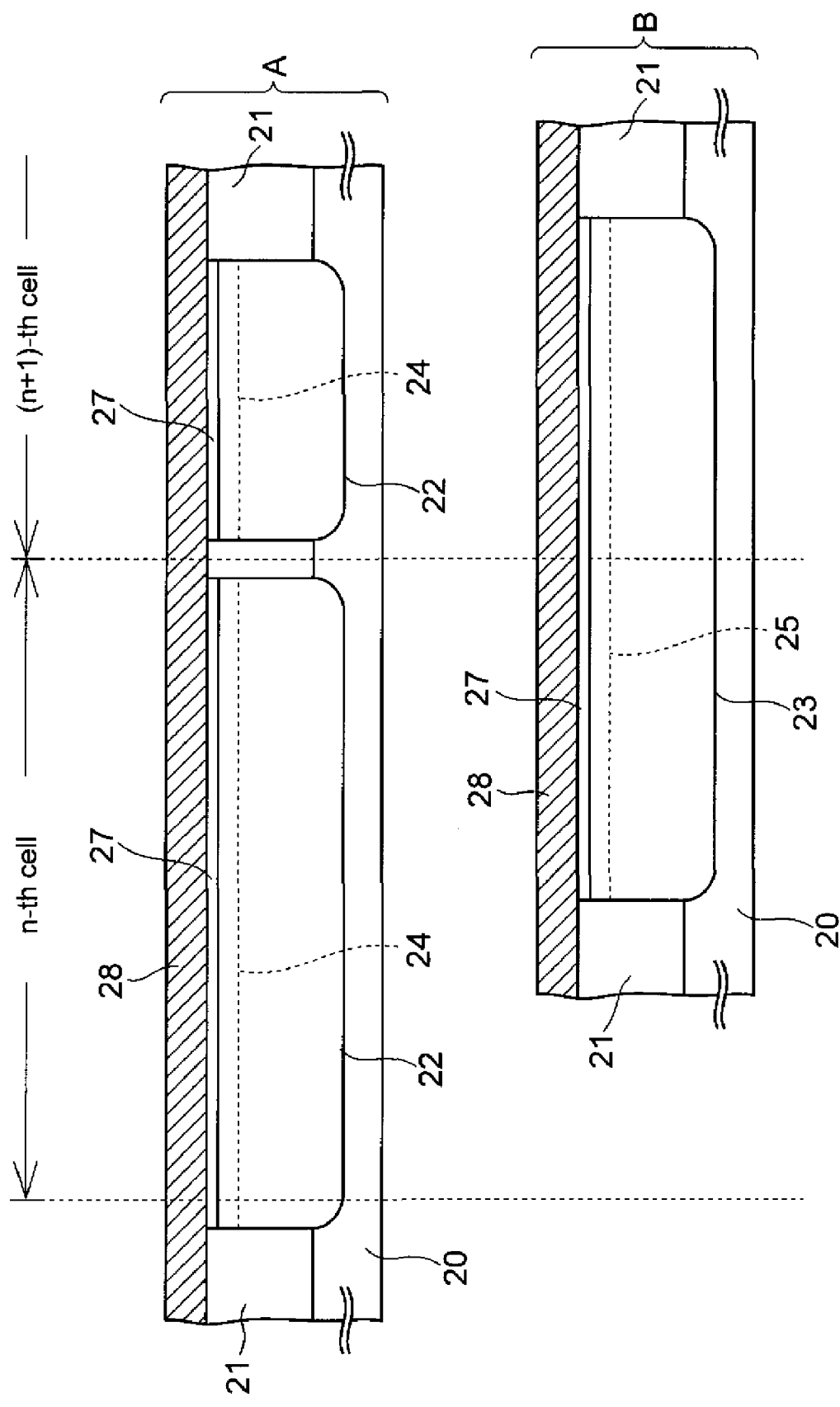
FIG. 12 is a cross-sectional view (No. 5) showing the semiconductor device in the process of manufacturing according to the first embodiment.

Subsequently, as shown in FIG. 12, as a conductive film 28 for gate electrode, a polysilicon film with a thickness of approximately 100 to 200 nm is formed on the gate insulating film 27 by a thermal CVD method. The conductive film 28 is not limited to the polysilicon film. For example, the conductive film 28 may be formed as a metal film such as an Al film, a Ti film, or a W film or a metal containing film such as a TiN film, an NiSi film, or a CoSi film.

Figure 13:
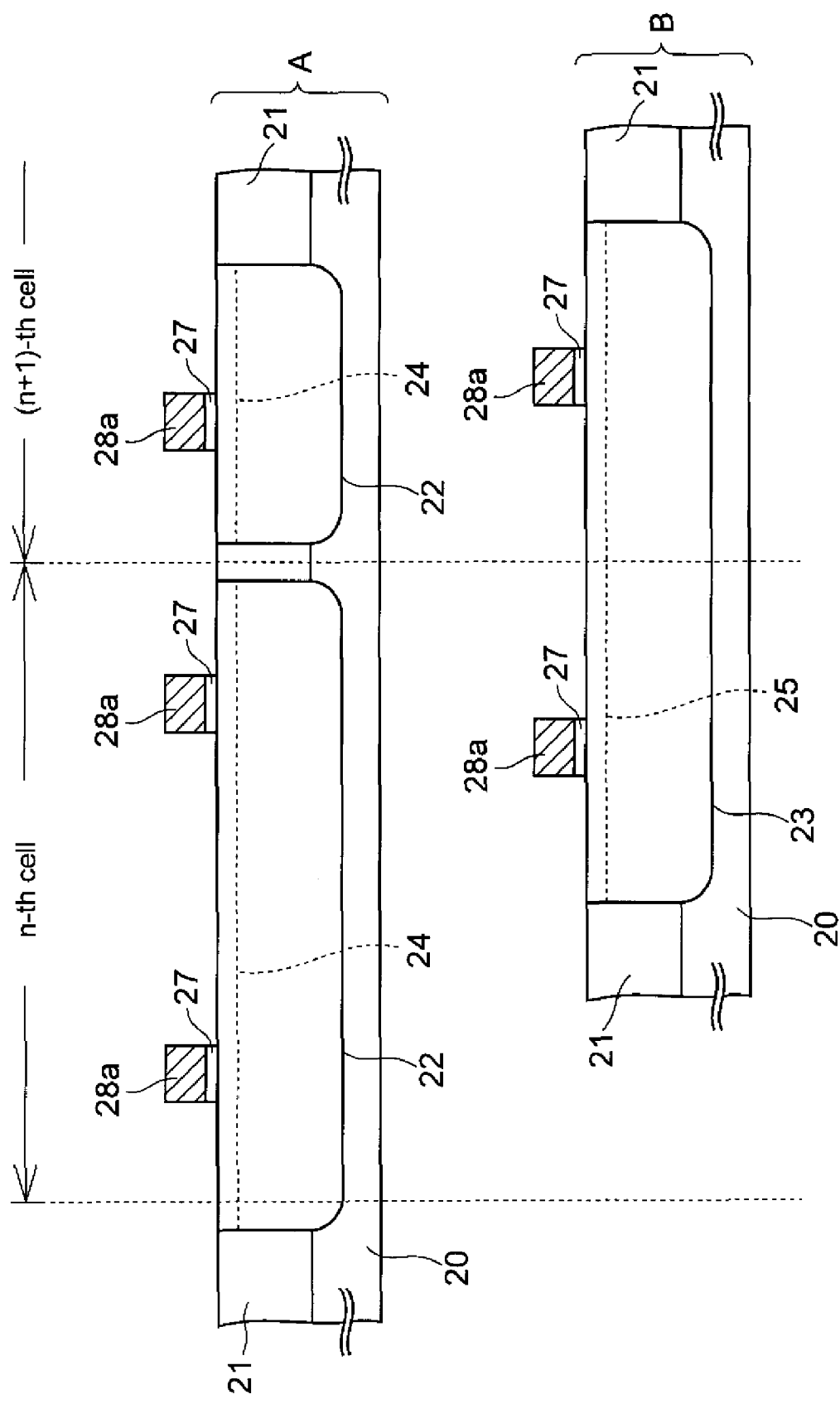
FIG. 13 is a cross-sectional view (No. 6) showing the semiconductor device in the process of manufacturing according to the first embodiment.

Thereafter, as shown in FIG. 13, the conductive film 28 and the gate insulating film 27 are patterned by the photolithography, and the conductive film 28 which is left without being etched is used as a plurality of gate electrodes 28a. A gate length of each gate electrode 28a is not particularly limited, but in the present embodiment, the conductive film 28 is patterned so as to have the gate length of approximately 45 to 200 nm.

Figure 14:
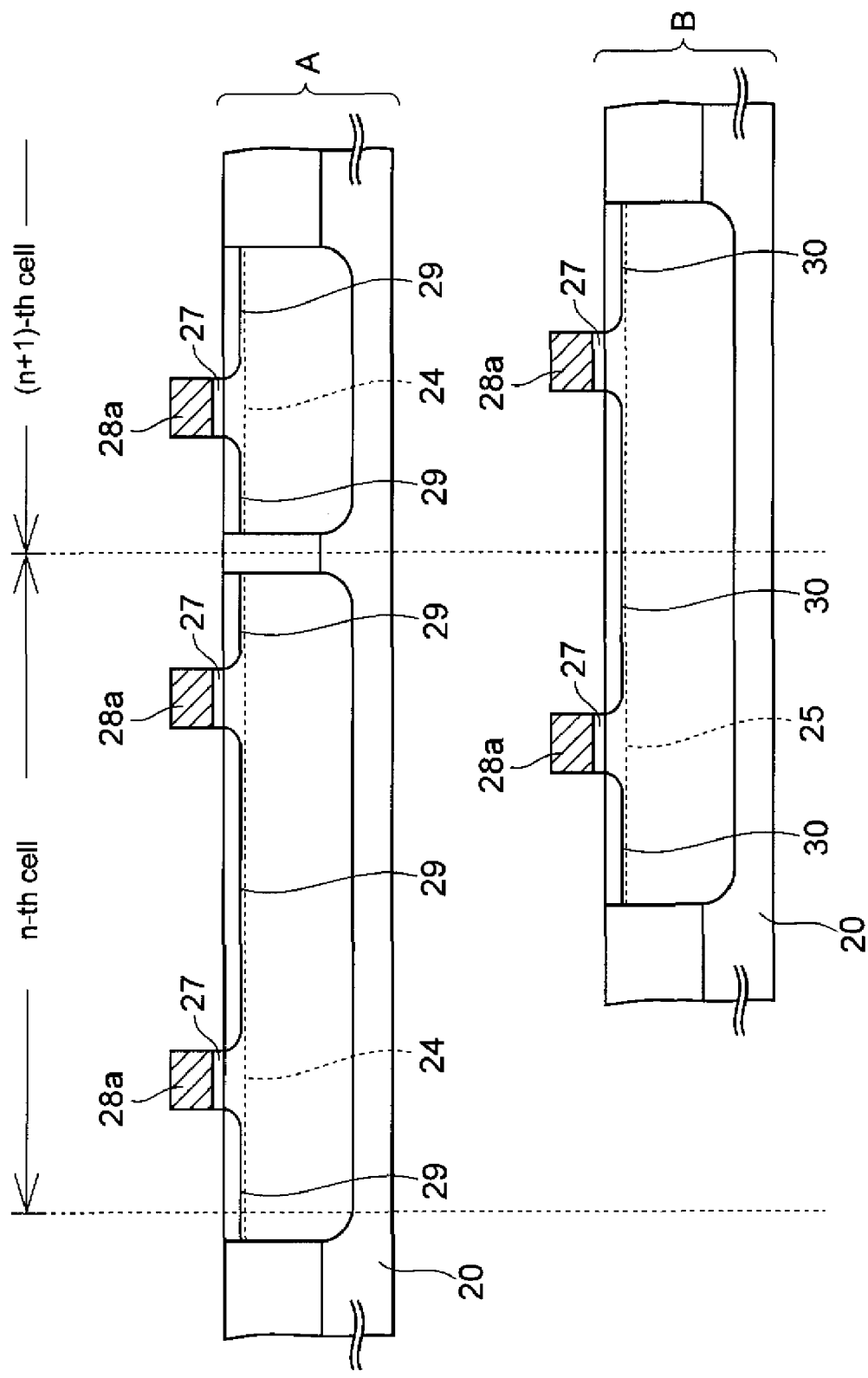
FIG. 14 is a cross-sectional view (No. 7) showing the semiconductor device in the process of manufacturing according to the first embodiment.

Next, steps for obtaining a cross-sectional structure shown in FIG. 14 will be described.

First, while using the gate electrodes 28a in the n-type MOS transistor forming region A as masks, arsenic as n-type impurities is ion-implanted into the silicon substrate 20 in the region A under conditions of, for example, acceleration energy of approximately 5 to 20 keV, a doze amount of approximately $1 \times 10^{13}$ to $5 \times 10^{13}$ cm$^{-2}$, and a tilt angle of 0°, so that n-type source/drain extensions 29 is formed.

Thereafter, under the same conditions as above conditions, BF$_2$ as p-type impurities is ion-implanted into the silicon substrate 20 in the p-type MOS transistor forming region B to form p-type source/drain extensions 30 as shown in the figure.

Note that these impurities are separately implanted by using a resist pattern which is not shown in the figure.

Figure 15:
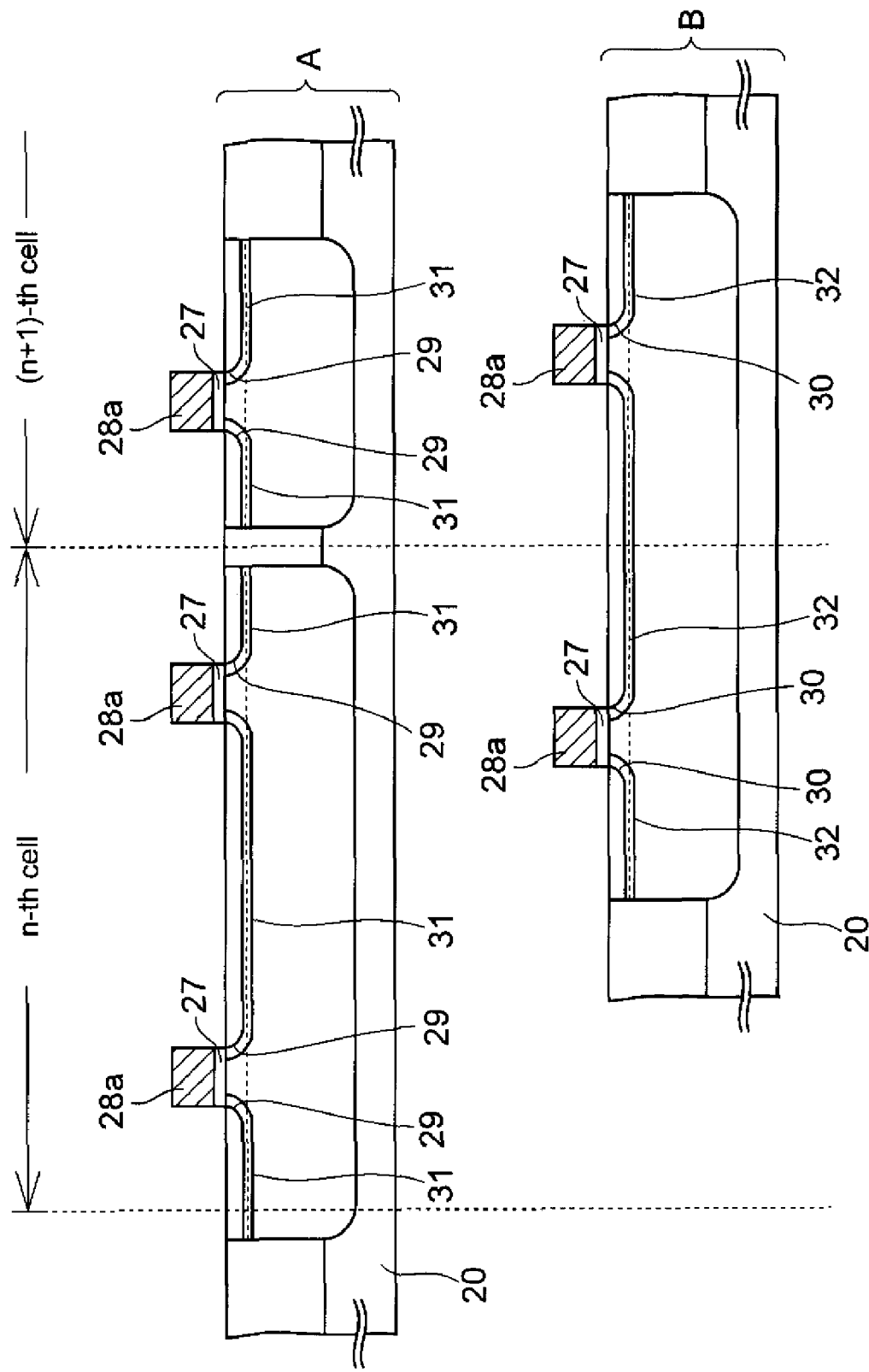
FIG. 15 is a cross-sectional view (No. 8) showing the semiconductor device in the process of manufacturing according to the first embodiment.

Next, as shown in FIG. 15, boron is ion-implanted as p-type impurities into the silicon substrate 20 in the n-type MOS transistor forming region A to form p-type pocket regions 31 next to the gate electrodes 28a. The conditions for the ion implantation are, for example, acceleration energy of approximately 10 to 35 keV, a doze amount of approximately $1 \times 10^{13}$ to $5 \times 10^{14}$ cm$^{-2}$, and a tilt angle of 0°.

Then, similar to this, n-type impurities, for example phosphorus, are ion-implanted into the silicon substrate 20 next to the gate electrodes 28a in the p-type MOS transistor forming region B to form n-type pocket regions 32 next to these electrode gates 28a as shown in the figure. The conditions for the ion implantation at this time are not particularly limited, but in the present embodiment, adopted are conditions in which acceleration energy is approximately 10 to 35 keV, in which a doze amount is approximately $1 \times 10^{13}$ to $5 \times 10^{14}$ cm$^{-2}$, and in which a tilt angle is 0°.

The pocket regions 31 and 32 formed in this manner play a role to suppress the decrease in a threshold voltage, which is observed when a gate length of each gate electrode 28a becomes shorter, and to improve roll off resistance of a MOS transistor to be formed later.

Figure 16:
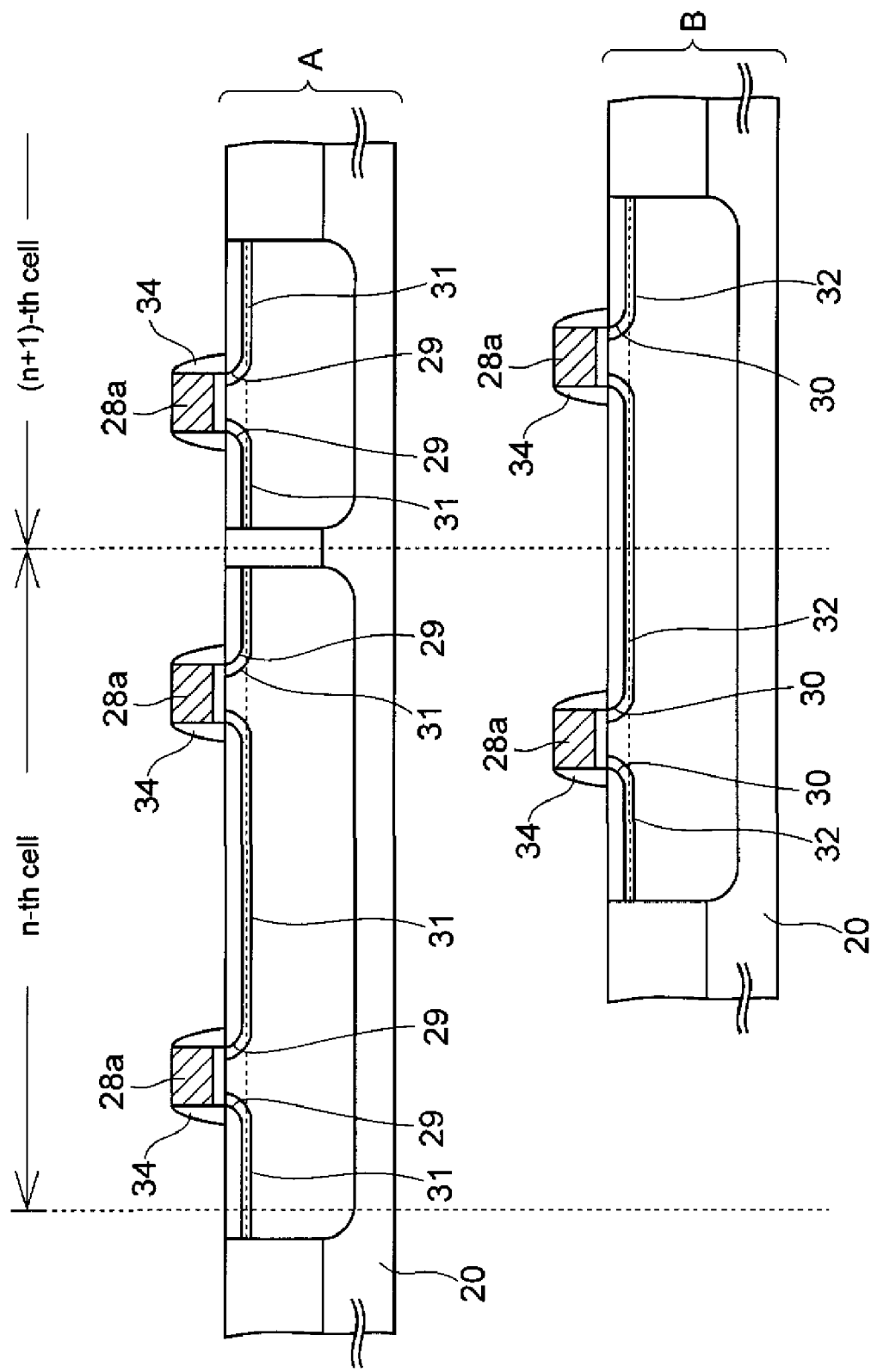
FIG. 16 is a cross-sectional view (No. 9) showing the semiconductor device in the process of manufacturing according to the first embodiment.

Next, as shown in FIG. 16, a silicon oxide film is formed on an entire upper surface of the silicon substrate 20 by the thermal CVD method. Thereafter, the silicon oxide film is etched back to be left beside the gate electrodes 28a as insulating side walls 34.

Figure 17:
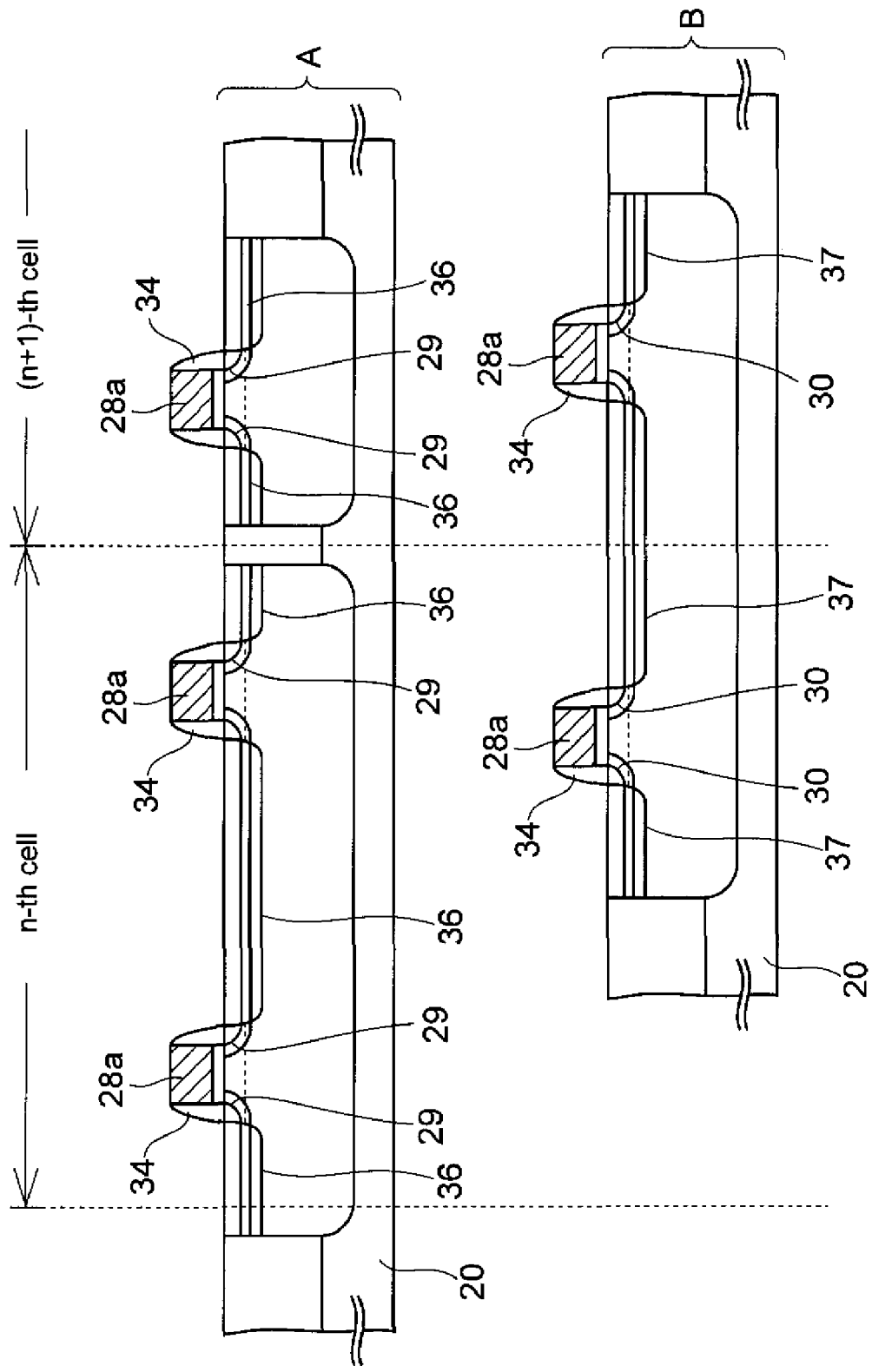
FIG. 17 is a cross-sectional view (No. 10) showing the semiconductor device according to the first embodiment.

Next, steps for obtaining a cross-sectional view as shown in FIG. 17 will be described.

First, while using the gate electrodes 28a as masks, phosphorus as n-type impurities is ion-implanted into the silicon substrate 20 of the n-type MOS transistor forming region A. The conditions of this ion-implantation are acceleration energy of approximately 5 to 30 keV, a doze amount of approximately $1 \times 10^{15}$ to $5 \times 10^{15}$ cm$^{-2}$, and a tilt angle of 7°. Consequently, n-type source/drain regions 36 are formed. Note that arsenic may be adopted as n-type impurities instead of phosphorus. If arsenic is used, a doze amount and a tilt angle are set to be as same as above, and acceleration energy is set to be approximately 5 to 40 keV.

Furthermore, by adopting similar conditions to these conditions, boron as p-type impurities is ion-implanted into the silicon substrate 20 of the p-type MOS transistor forming region B, so that p-type source/drain regions 37 are formed next to the gate electrodes 28 in the region B. In the present embodiment, adopted are conditions for the ion-implantation in which acceleration energy is approximately 5 to 20 keV, in which a doze amount is approximately $1 \times 10^{15}$ to $5 \times 10^{15}$ cm$^{-2}$, and in which a tilt angle is 0°. In addition, as p-type impurities, BF$_2$ may be used instead of boron. In this case, acceleration energy is set to be approximately 5 to 30 keV.

Note that the above-described ion implantation is carried out by separately implanting n-type impurities and p-type impurities with use of a resist pattern which is not shown in the figure. The resist pattern is removed at the time when the ion implantation is finished.

After the resist pattern is removed, a RTA (rapid thermal anneal) with a substrate temperature of approximately 900 to 1000° C. is carried out in a nitrogen atmosphere as activating anneal to activate impurities in the source/drain regions 36 and 37.

Figure 18:
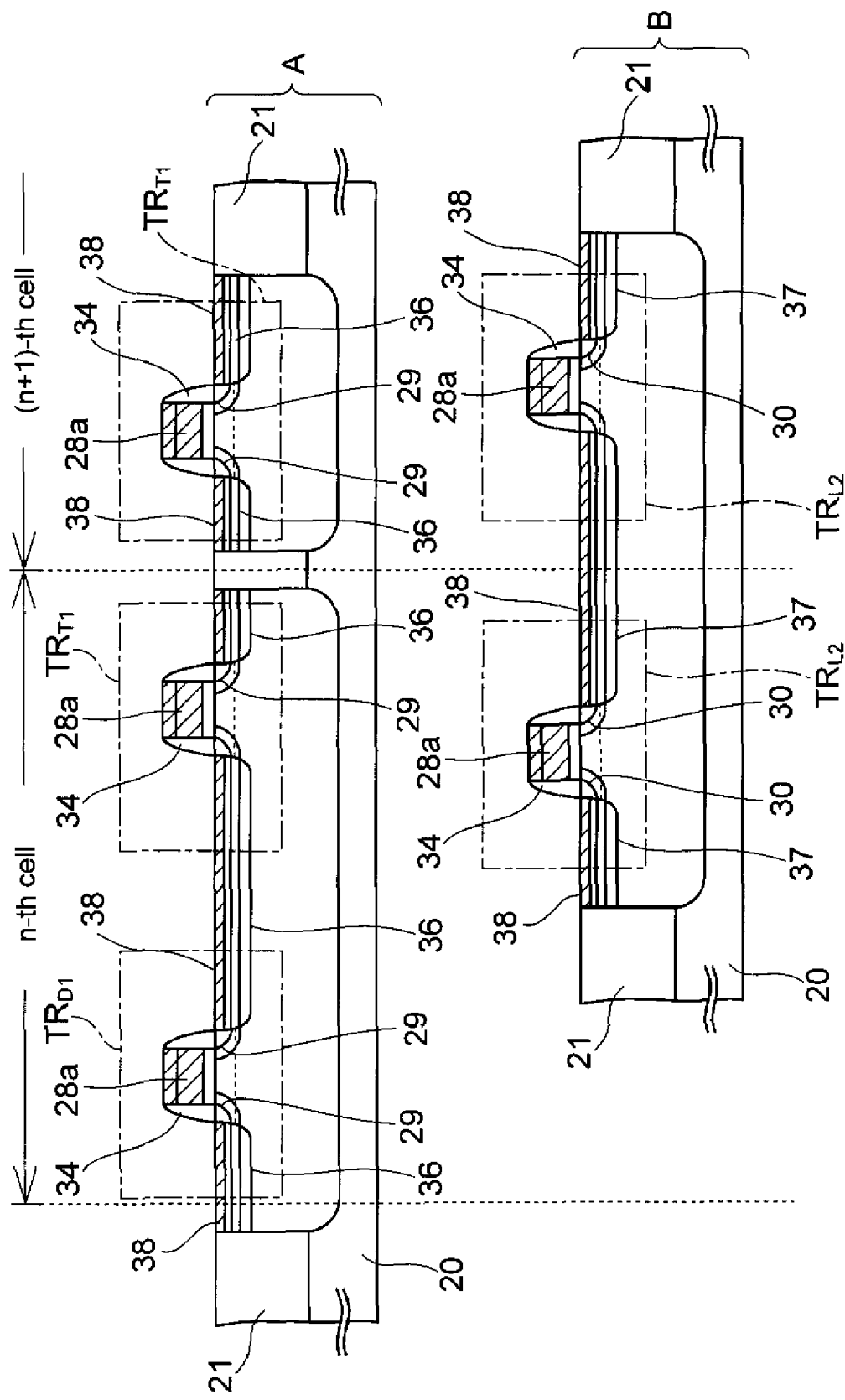
FIG. 18 is a cross-sectional view (No. 11) showing the semiconductor device in the process of manufacturing according to the first embodiment.

Next, steps for obtaining a cross-sectional structure as shown in FIG. 18 will be described.

First, a cobalt (Co) film as a refractory metal film is formed on an entire upper surface of the silicon substrate 20 by a sputtering method. Refractory metal films, which are applicable to the present embodiment, include a nickel (Ni) film and a zirconium (Zr) film in addition to a cobalt film.

Subsequently, the refractory metal film is caused to react with silicon by thermal processing to form refractory metal silicide films 38 on surface layer of the silicon substrate 20. The refractory metal silicide films 38 are also formed on upper surfaces of the gate electrodes 28a formed of polysilicon. This allows the gate electrodes 28a to have lower resistance. After that, the refractory metal film which is unreacted on the device isolation insulating film 21 and the like is removed by wet etching.

Figure 19:
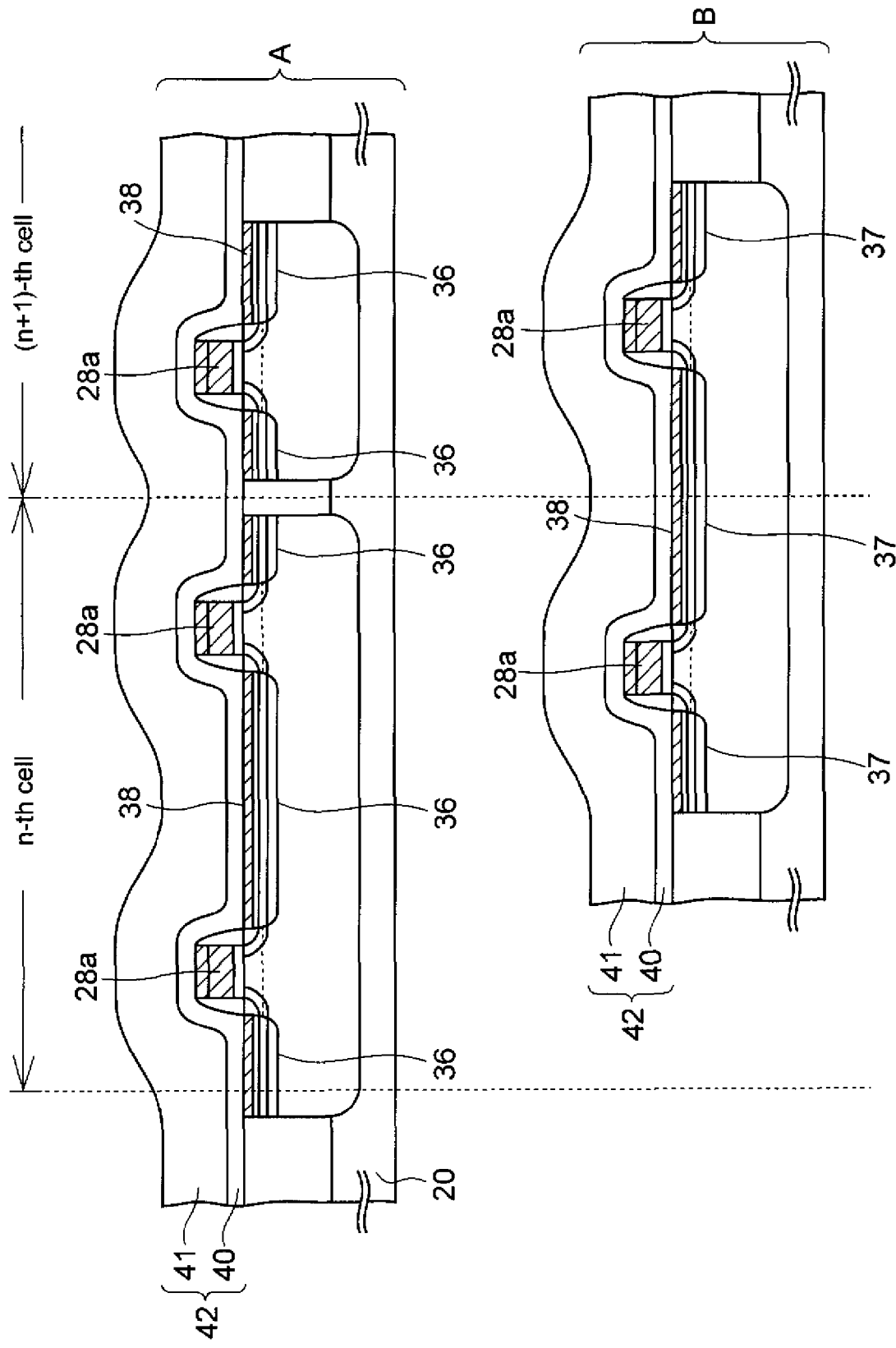
FIG. 19 is a cross-sectional view (No. 12) showing the semiconductor device in the process of manufacturing according to the first embodiment.

Next, as shown in FIG. 19, a silicon nitride (SiN) film with a film thickness of approximately 30 nm is formed on an entire upper surface of the silicon substrate 20 by low pressure CVD method. Thereafter, a silicon oxide film 41 with a film thickness of approximately 400 nm is further formed thereon by a thermal CVD method. The silicon nitride film 40 and the silicon oxide film 41 are used as an interlayer insulating film 42.

Figure 20:
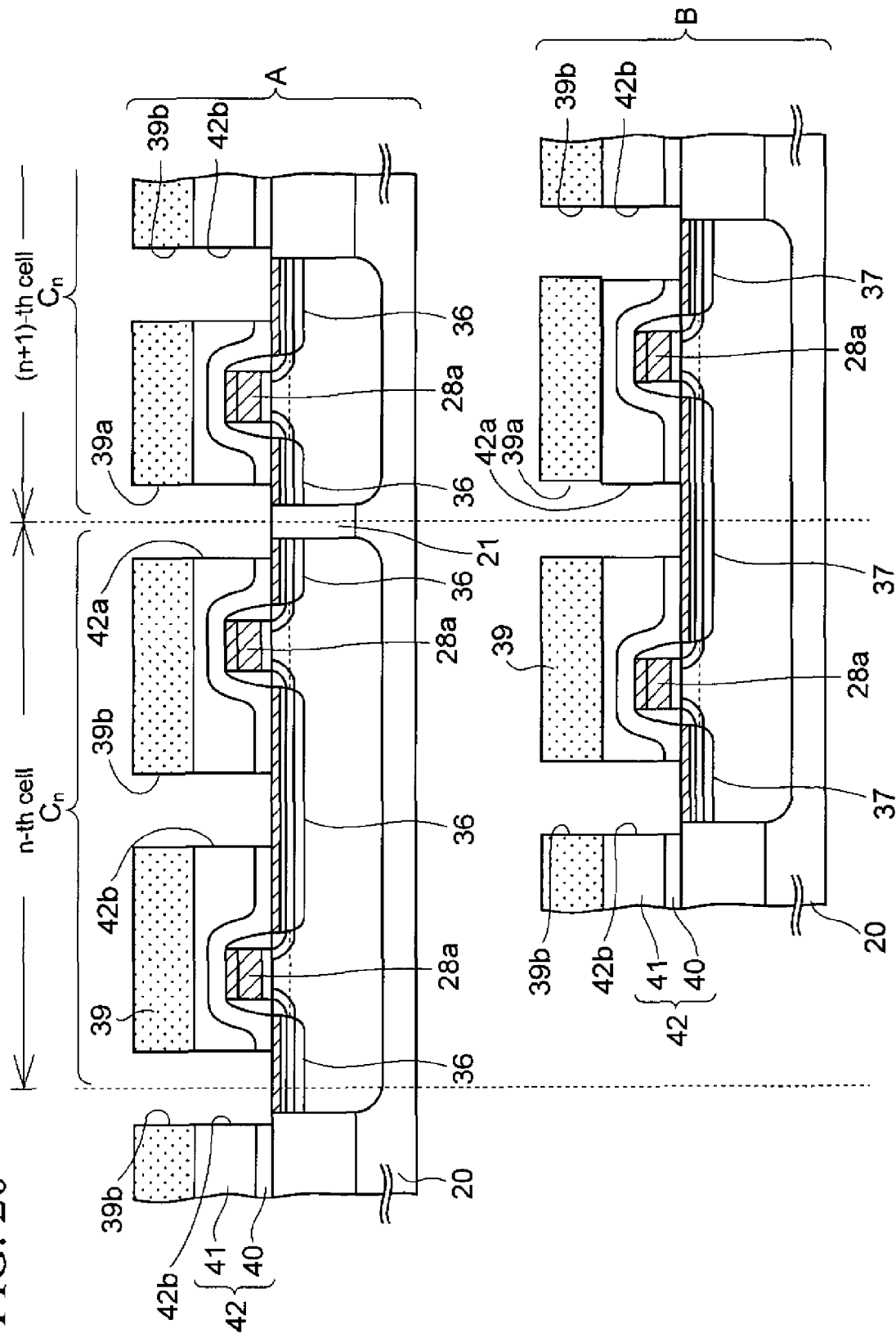
FIG. 20 is a cross-sectional view (No. 13) showing the semiconductor device in the process of manufacturing according to the first embodiment.

Next, steps for obtaining a cross-sectional structure as shown in FIG. 20 will be described.

First, the upper surface of the silicon oxide film 41 is polished and planarized by the CMP method, and thereafter third resist patterns 39, provided with first and second windows 39a and 39b on each of the source/drain regions 36 and 37, is formed. After that, the silicon oxide film 41 is selectively etched through the first and second windows 39a and 39b by a RIE (reactive ion etching) using a gas mixture of CHF$_3$, Ar and O$_2$ as an etching gas to form first and second holes 42a and 42b on each of the source/drain regions 36 and 37.

Among those holes, the first holes 42a are formed in the n-type MOS transistor forming region A, and are formed so as to commonly overlap with two adjacent n-type active regions C$_n$ and the device isolation insulating film 21 formed therebetween.

In addition, since an etching speed of the silicon nitride film 40 against the etching gas is lower than that of the silicon oxide film 41, the silicon nitride film 40 functions as a stopper film for the etching, and the etching automatically stops on the upper surface of the silicon nitride film 40.

Next, the etching gas is changed to a gas mixture of C$_4$F$_8$, Ar and O$_2$, and the silicon nitride films 40 under the first and second holes 42a and 42b are selectively etched and opened to expose the refractory silicide layers 38 in the holes 42a and 42b. In the etching of the silicon nitride films 40, the refractory silicide films 38 function as stoppers for the etching.

After that, the third resist patterns 39 used as the etching patterns are removed.

Figure 21:
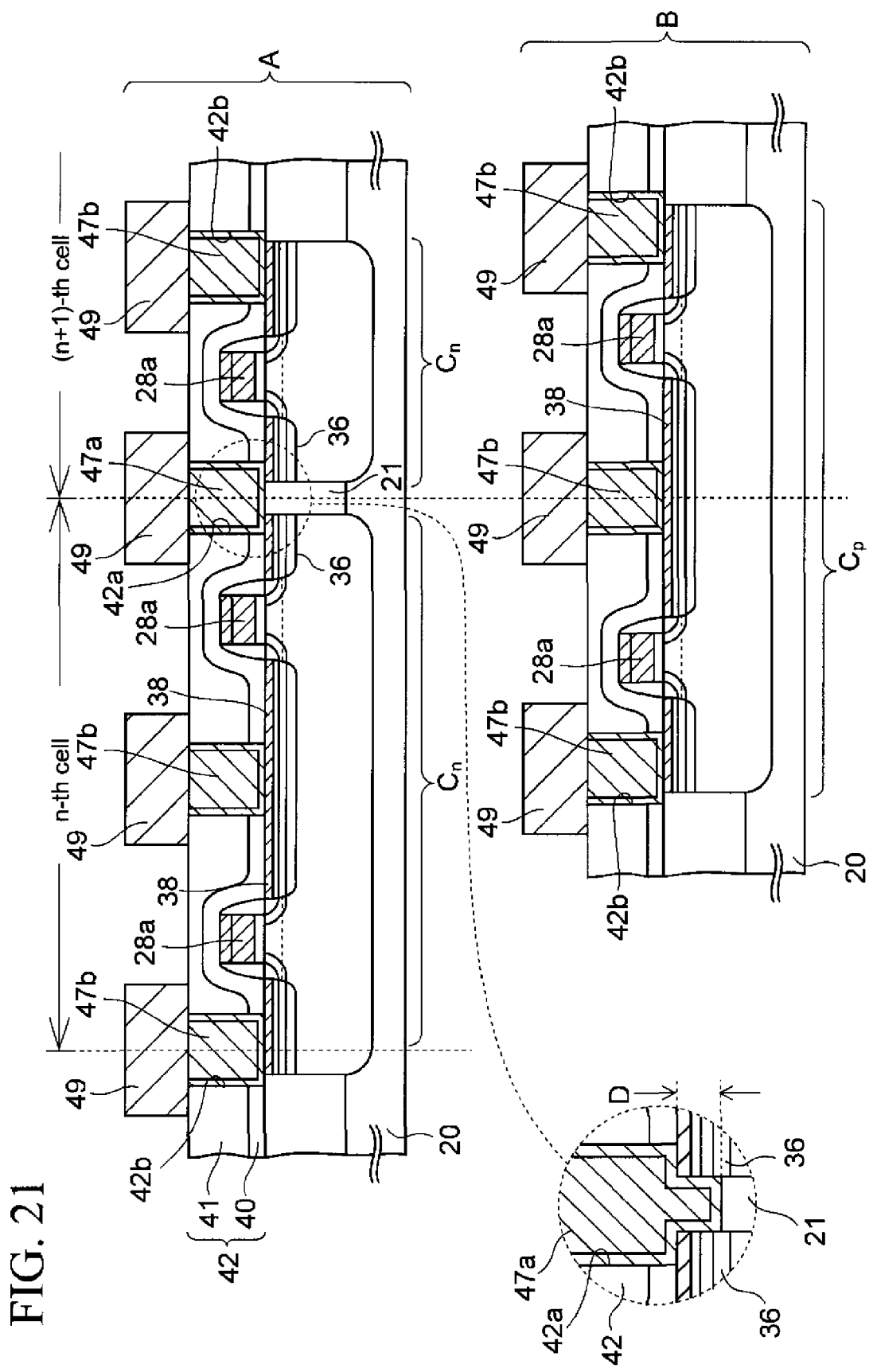
FIG. 21 is a cross-sectional view (No. 14) showing the semiconductor device in the process of manufacturing according to the first embodiment.

Next, steps for obtaining a cross-sectional structure as shown in FIG. 21 will be described.

First, on inner surfaces of the first and second holes 42a and 42b and on an upper surface of the interlayer insulating film 41, a titanium nitride (TiN) film with a thickness of approximately 20 nm is formed as a barrier metal film by the thermal CVD method. After that, a tungsten (W) film is formed on the barrier metal film by the thermal CVD method using a tungsten hexafluoride gas as a reaction gas to completely embed the first and second holes 42a and 42b.

Thereafter, the excess barrier metal film and the tungsten film which are formed on the interlayer insulating film 41 are polished and removed by the CMP method. These films are left only inside the first and second holes 42a and 42b.

In this manner, the barrier metal film and the tungsten film which are left inside the first hole 42a, constitute a first conductive plug 47a. The first conductive plug 47a allows the adjacent n-type active regions $C_n$ to be electrically connected.

On the other hand, these films left inside the second holes 42b constitute second conductive plugs 47b, which are electrically connected with the refractory metal silicide layer 38 in the n-type MOS transistor forming region A and the p-type MOS transistor forming region B.

After that, on the first and second conductive plugs 47a and 47b and on the interlayer insulating film 41, a metal laminated film containing an aluminum film is formed by the sputtering method. The metal laminated film is patterned by photolithography to be made into a metal wiring 49.

Figure 25:
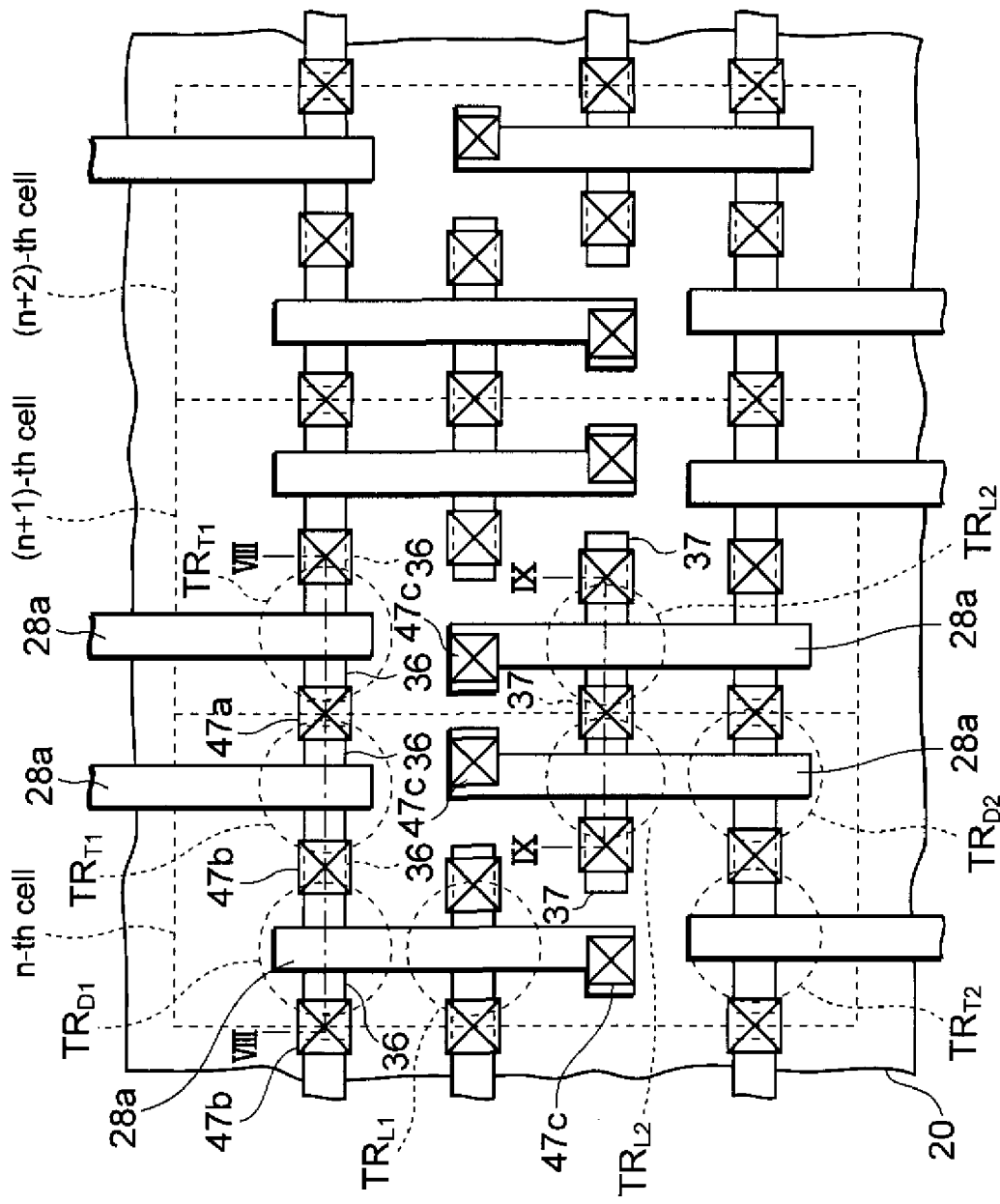
FIG. 25 is a plan view (No. 4) of the semiconductor device in the process of manufacturing according to the first embodiment.

FIG. 25 is a plan view after this step is finished. Note that in the figure, in order to avoid making the figure to be complicated, the interlayer insulating film 42 and the metal wiring 49 are omitted. In addition, in above-described FIG. 21, the cross-sectional view of the n-type MOS transistor forming region A corresponds to a cross-sectional view taken along the VIII-VIII line in FIG. 25. The cross-sectional view of the p-type MOS transistor forming region B corresponds to a cross-sectional view taken along the IX-IX line in FIG. 25.

As shown in FIG. 25, in an n-th cell, two transfer transistors $TR_{T1}$ and $TR_{T2}$ and two driver transistors $TR_{D1}$ and $TR_{D2}$, all of which are n-type transistors, are formed. Furthermore, in addition to these transistors, two load transistors $TR_{L1}$ and $TR_{L2}$, both of which are p-type transistors, are formed as shown in the figure.

Then, among these transistors, the source/drain regions 36 of the driver transistor $TR_{D2}$ in adjacent cells are divided by the device isolation insulating film 21 as described above, and these source/drain regions 36 are electrically connected with each other by the first conductive plug 47a. Furthermore, the source/drain regions 36 of the transfer transistors $TR_{T1}$ and $TR_{T2}$ in the adjacent cells have a similar structure of being electrically connected with each other by the first conductive plug 47a.

Figure 1:
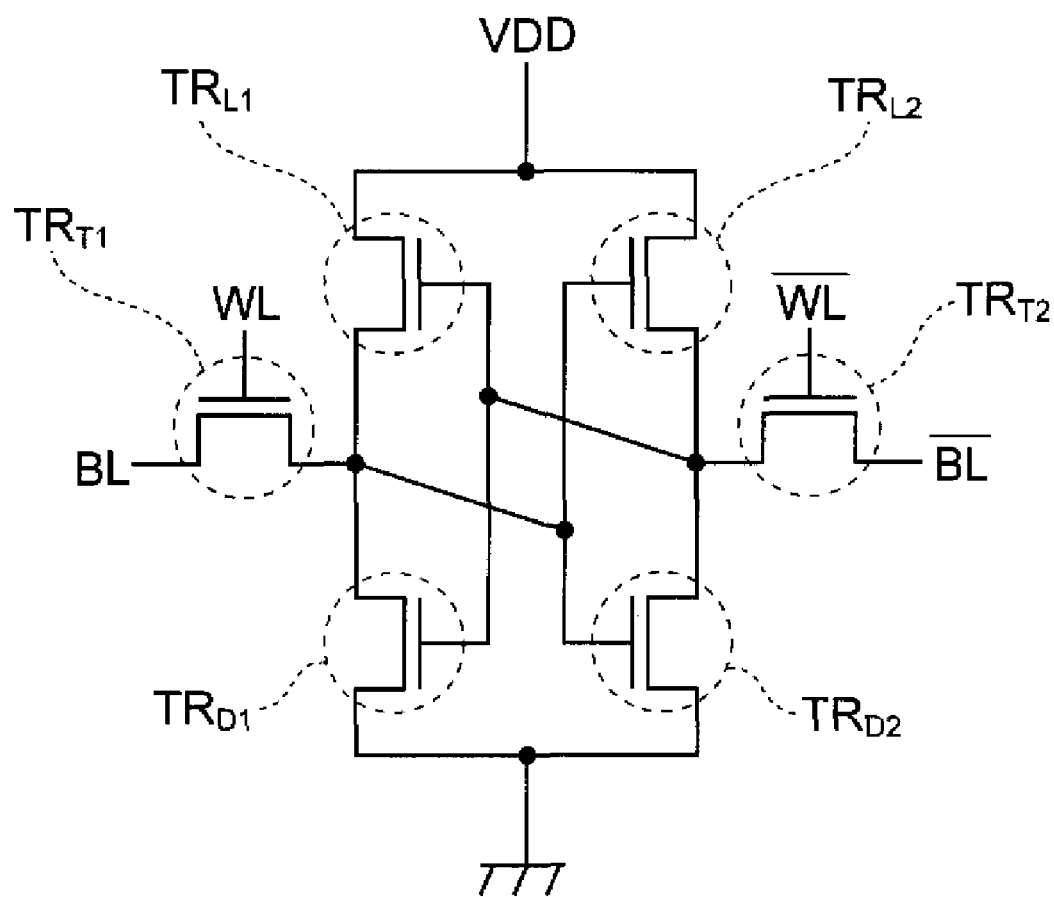
FIG. 1 is an equivalent circuit of a six-transistor-type SRAM.

In addition, the above-described six transistors $TR_{T1}$, $TR_{T2}$, $TR_{D1}$, $TR_{D2}$, $TR_{L1}$, and $TR_{L2}$ are connected by the metal wiring 49 in the same way as the equivalent circuit shown in FIG. 1, so that one cell of a stripe-shaped SRAM is formed. Note that, as shown in FIG. 25, third conductive films 47c are formed on end portions of the gate electrodes 28a by the same process as that of the above-described first and second conductive plugs 47a and 47b.

With the above described steps, a basic structure of SRAM according to the present embodiment is completed.

According to the present embodiment, as shown in FIG. 22, the n-type active region $C_n$ is divided by the device isolation insulating film 21 into plural pieces so as to make a length L for each active region $C_n$ to be shorter. Accordingly, the extent of stress, which is applied to the silicon substrate 20 in the active region $C_n$ due to a difference in stress of the device isolation insulating film 21 and the silicon substrate 20, can be reduced. Also, even if the silicon substrate 20 is caused to move in a longitudinal direction of the active region $C_n$ by the stress, the movement can be prevented by the device isolation insulating film 21.

For this reason, increase in a diffusion coefficient of impurities in the silicon substrate 20 due to the stress can be prevented. Thus, for example, it can be prevented that the impurities such as phosphors introduced into the n-type source/drain regions 36 (see, FIG. 18) widely diffuse during activating annealing, and that the n-type source/drain regions 36 excessively come closer with each other under the gate electrodes 28a. As a result, a sub-threshold leak current of the transistors $TR_{D1}$ and $TR_{T1}$ in an off-state is reduced, and thus the power consumption of the SRAM in a stand-by state can be suppressed as compared with a conventional structure.

Meanwhile, the two adjacent active regions $C_n$ which are divided by the device isolation isolating film 21 as described above is, as shown in the cross-sectional view of FIG. 21, electrically connected with each other by the first conductive plug 47a. Since the first hole 42a in which the first conductive plug 47a is embedded is formed on the device isolation insulating film 21 between the two active regions $C_n$, when the first hole 42a is formed in the step of FIG. 20 by the etching, the device isolation insulating film 21 under the first hole 42a is also etched for some extent. Therefore, a bottom edge of the first conductive plug 47a is embedded in the device isolation insulating film 21. Note that if an embedded depth D is large, as described in FIG. 6 of the conventional example, there is a possibility that a leak path is formed from the first conductive plug 47a to the silicon substrate 20.

To avoid such an inconvenience, in the present embodiment, at the time when the p-type channel region 24 is formed in the step of FIG. 9, the peak depth of the impurities in the p-type channel region 24 is set to be as shallow as possible, for example, 0.015 μm or less.

Figure 26:
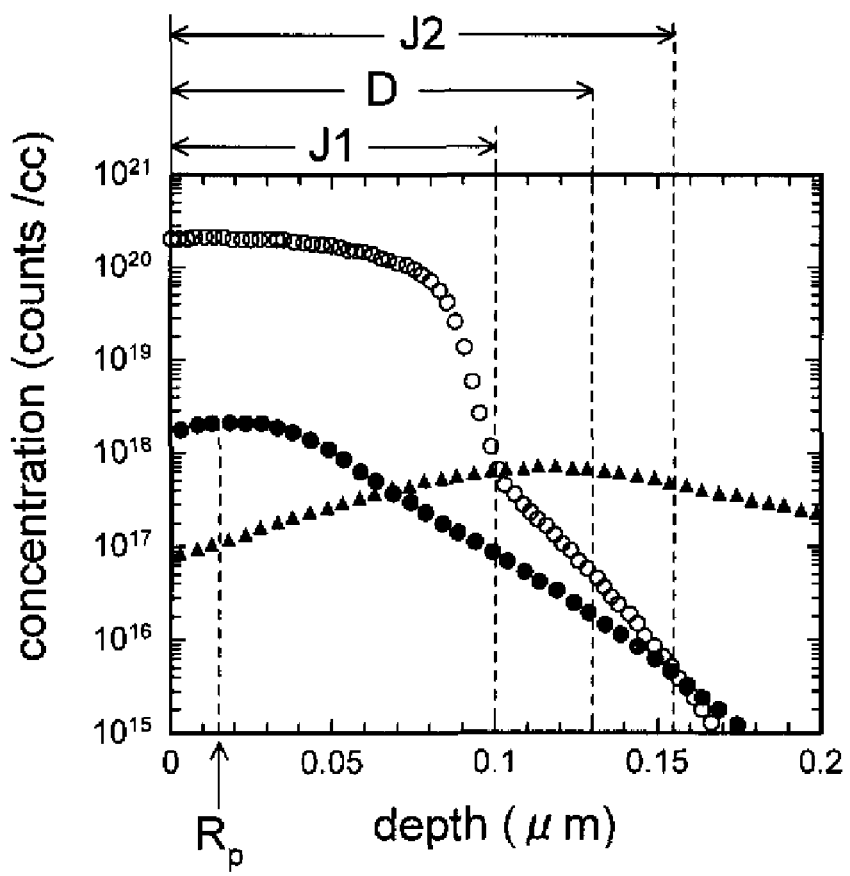
FIG. 26 is a graph showing concentration profiles of each of impurities of a p-type channel region and an n-type source/drain region in the first embodiment.

FIG. 26 is a graph showing concentration profiles of the impurities of each of the p-type channel region 24, of which peak depth Rp of the impurity concentration is formed so as to be 0.015 μm or less, and the n-type source/drain region 36. Note that in the graph, a concentration profile of a p-type channel region generally adopted in a conventional structure is also shown as a comparative example.

The junction depth of the n-type source/drain region 36 is defined as the depth for which each of the impurities of the source/drain region 36 and the p-type channel region 24 compensates. In other words, the junction depth is a depth of an intersection of the impurity concentration profiles of these regions 36 and 24.

In the comparative example, since the p-type channel region is formed in a deep portion in the silicon substrate, the impurity concentration of the p-type channel region is relatively high even in the deep portion from the surface of the silicon substrate. For this reason, the concentration profiles of the p-type channel region and the n-type source/drain region 36 are crossed at a very shallow portion (approximately 0.1 μm), and the junction depth J1 of the n-type source/drain region 36 becomes shallow (approximately 0.1 μm).

In contrast, in the present embodiment, the peak depth Rp of the impurity concentration of the p-type channel region 24 is set to be as shallow as 0.015 μm from the surface of the silicon substrate 20. Thus, the intersection of the concentration profiles of the p-type channel region 24 and the n-type source/drain region 36 can be moved to a portion deeper than that of the comparative example. Accordingly, a p-n junction of the n-type source/drain region 36 can be formed in a depth J2 (approximately 0.16 μm) deeper than the embedded depth D of the first conductive plug 47a.

Accordingly, as shown in the dotted circle in FIG. 21, for example, in order to prevent the first hole 42a from being unopened, even if the first hole 42a is formed so as to be overetched compared with the film thickness of the interlayer insulating film 42, and the device isolation insulating film 21 under the first hole 42a is etched, the bottom edge of the first conductive plug 47a can be set to be shallower than the n-type source/drain region 36.

Thereby, it is possible to reduce a risk that the bottom edge of the first conductive plug 47a comes into direct contact with the silicon substrate 20, and accordingly to effectively prevent a leak path from being formed from the first conductive plug 47a to the silicon substrate 20. As a result, consumption power which is excessively generated in the leak path of the MOS transistor in a stand-by state can be reduced. Thus, a consumption current of the SRAM becomes smaller than that of a conventional structure, and mobile devices capable of being used for a long time can be provided.

Furthermore, as shown in FIG. 23, the first resist pattern 18, which is used as a mask at the time when the p-type channel region 24 is formed by ion implantation, suffices to be formed such that all of the divided n-type active regions $C_n$ are exposed, so that high accuracy of alignment with the silicon substrate 20 is not required. For this reason, unlike the method disclosed in patent literature 2 as described in FIG. 7 where the resist pattern 15 is formed so that the window 15a overlaps with the boundary portion between the device isolation insulating film 6 and the active region 3, there can be reduced a risk that the p-type impurities do not be implanted into the silicon substrate 20. Thus, the leak current can be surely suppressed.

Note that in the above description, as shown by the dotted circle K in FIG. 22, the n-type active region $C_n$ is divided by the device isolation insulating film 21 in a portion between the adjacent cells. However, the dividing manner is not limited to this.

Figure 27:
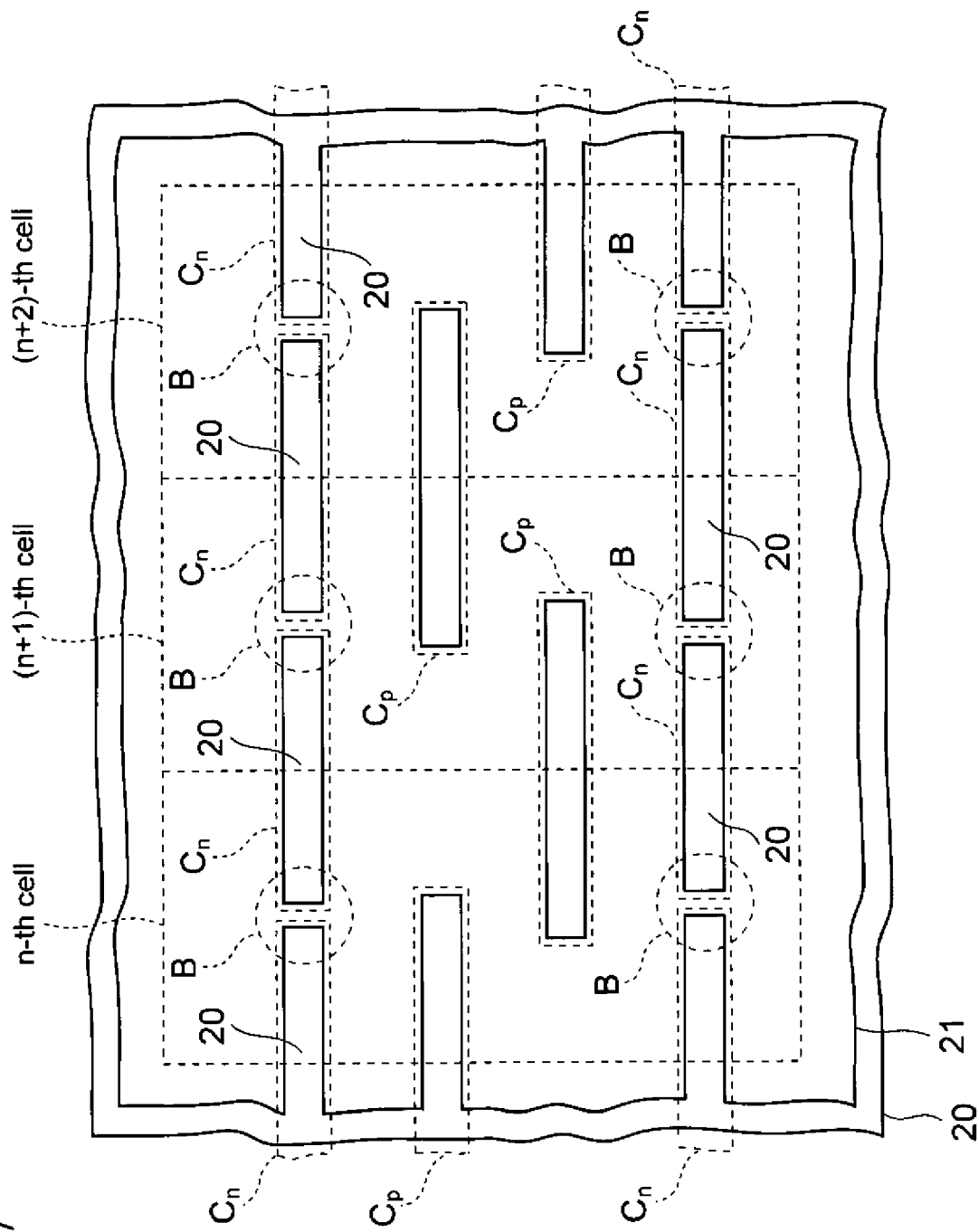
FIG. 27 is a plan view showing another way of dividing an n-type active region in the first embodiment.

FIG. 27 is a plan view showing another way to divide the n-type active region $C_n$ in the stripe-shaped SRAM. Note that the same reference numerals as FIG. 22 are given to the same components as those of FIG. 22.

As shown in dotted circles B, in this example, the n-type active region $C_n$ is divided in one cell.

Figure 28:
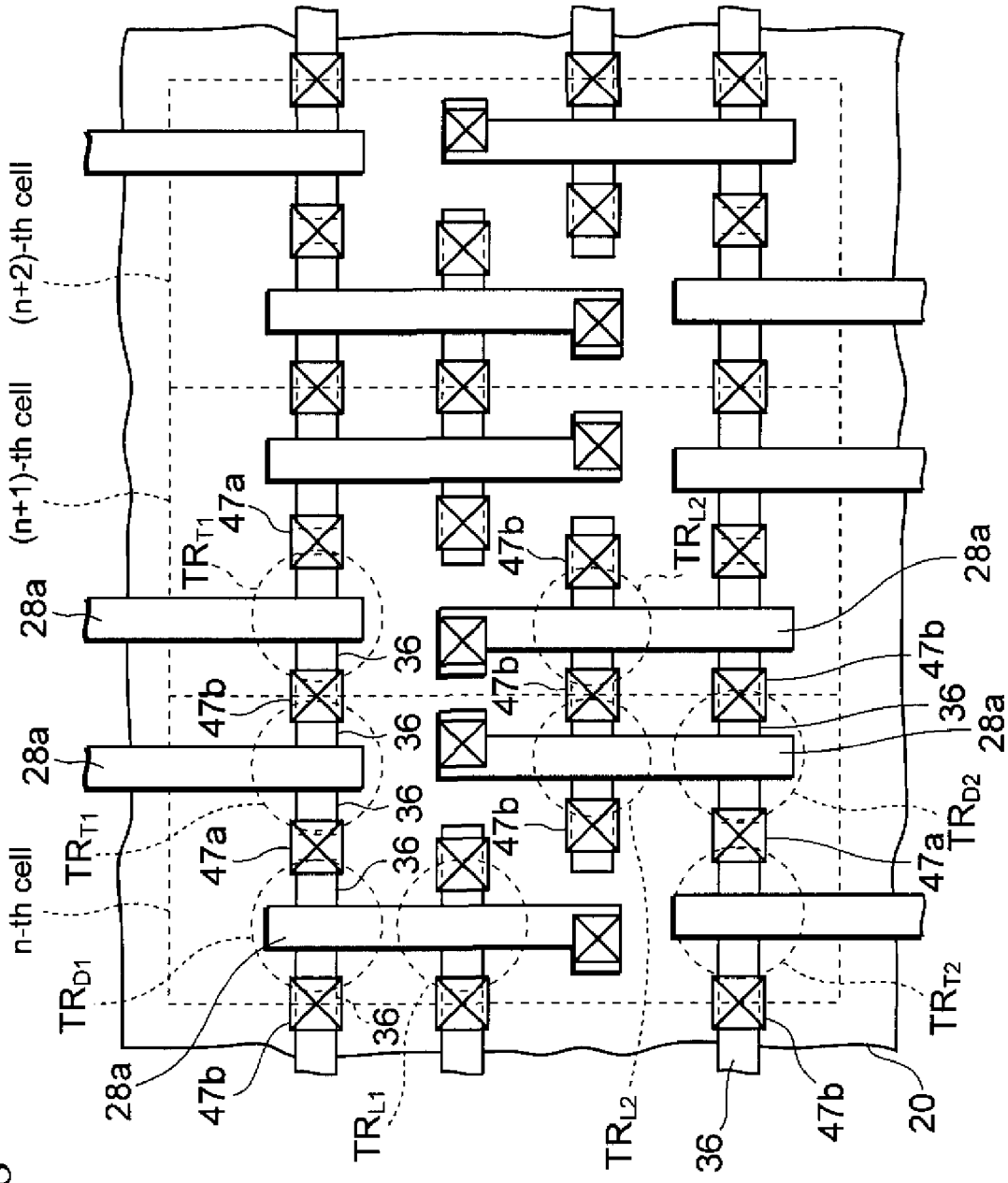
FIG. 28 is a plan view in a case where a gate electrode is formed on the n-type active region of FIG. 27.

FIG. 28 is a plan view showing a case where the first to third gate electrodes 28a to 28c are formed on the n-type active region $C_n$ which is divided as described above, to form the six transistors $TR_{T1}$, $TR_{T2}$, $TR_{D1}$, $TR_{D2}$, $TR_{L1}$ and $TR_{L2}$ which constitute the SRAM.

As shown in this figure, in this example, the source/drain regions 36 of the adjacent driver transistor $TR_{D1}$ and the transfer transistor $TR_{T1}$ are electrically connected with each other by the first conductive plug 47a. In the same way, the n-type source/drain regions 36 of another driver transistor $TR_{D2}$ and the transfer transistor $TR_{T2}$ in one cell are also electrically connected with each other by the first conductive plug 47a.

With this plan layout of the device isolation insulating film 21, it is also possible to reduce the stress that the silicon substrate 20 receives in the n-type active region $C_n$, so that the sub-threshold leak of the transistors $TR_{D1}$, $TR_{T1}$, $TR_{D2}$, and $TR_{T2}$ can be reduced with the above-described reasons.

(2) Second Embodiment

In the above-described first embodiment, the n-type active region $C_n$ is divided into plural pieces in the stripe-shaped SRAM so as to reduce the stress that the silicon substrate 20 receives in the n-type active region $C_n$.

In contrast, in the present embodiment, active regions $C_n$ and $C_p$ of bent-shaped SRAM are divided into plural pieces. Note that a method for manufacturing this bent-shaped SRAM is the same as that of the stripe-shaped SRAM described in the first embodiment. Accordingly, only a plan view thereof will be shown below, and the description of the manufacturing method will be omitted.

(i) First Example

Figure 29:
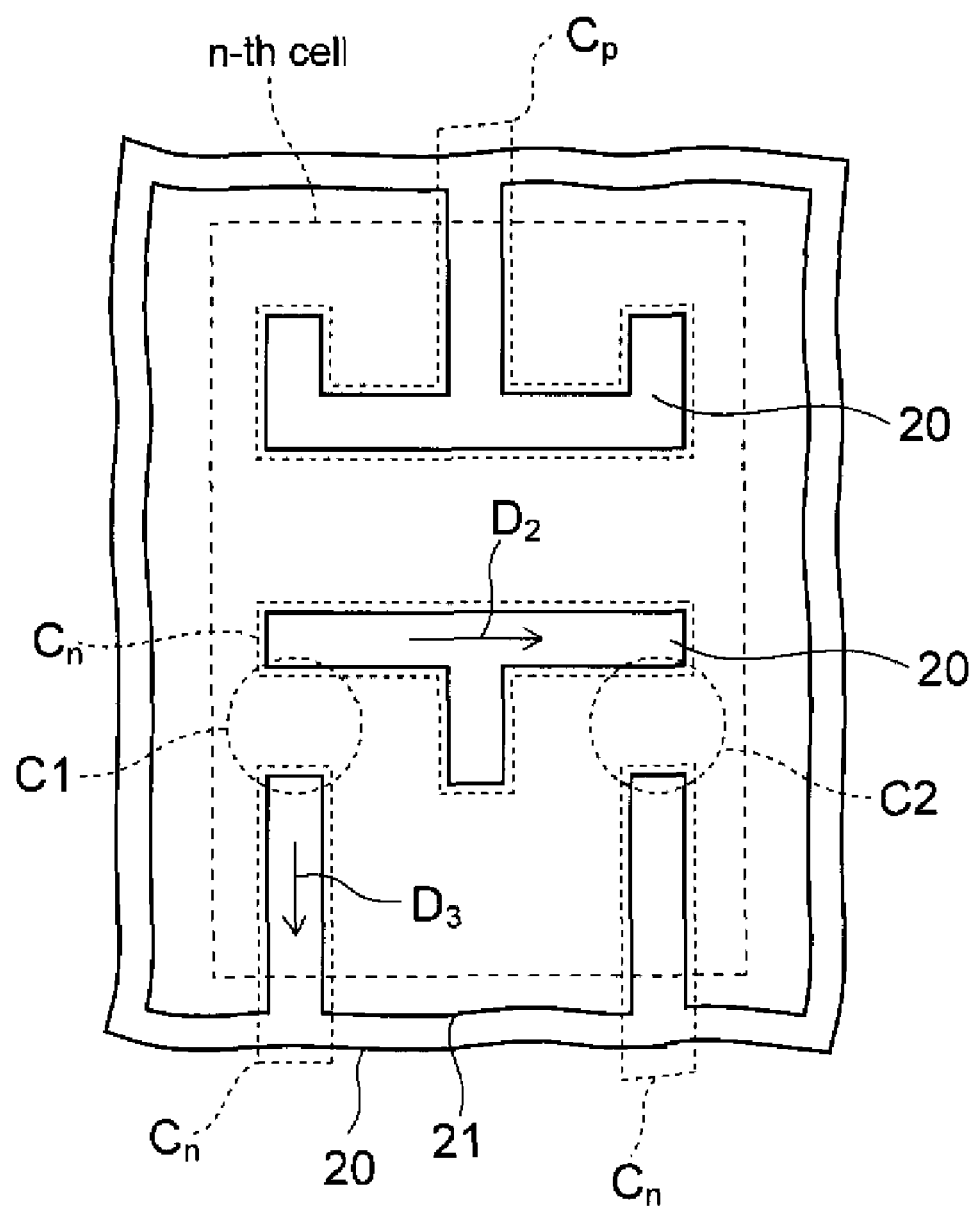
FIG. 29 is a view showing a plan layout of an active region of a semiconductor device (first example) according to a second embodiment.
Figure 30:
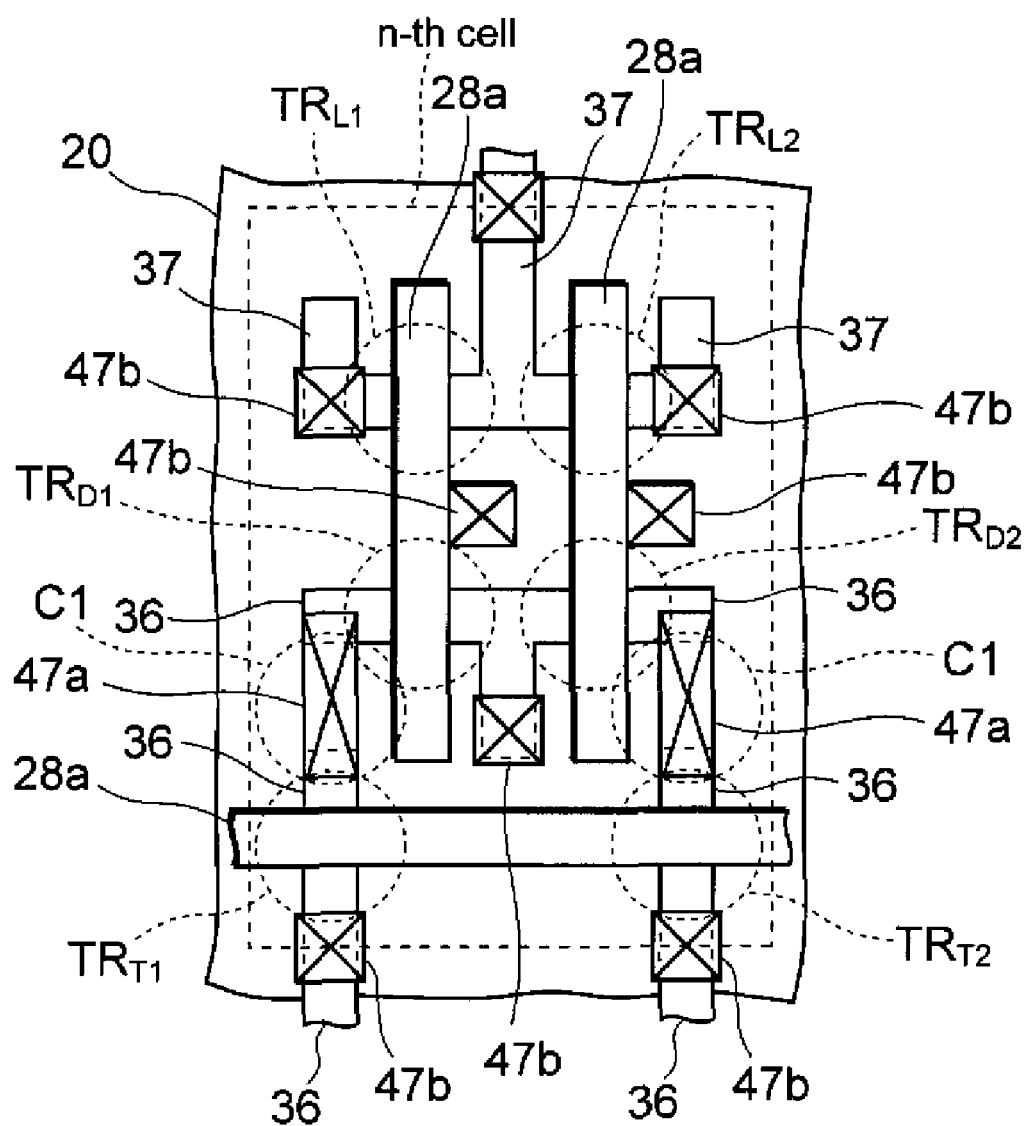
FIG. 30 is a plan view in a case where a gate electrode is formed on the active region of FIG. 29.

FIG. 29 is a view showing a plan layout of active regions $C_n$ and $C_p$ of a bent-shaped SRAM according to a first example. FIG. 30 is a plan view showing a case where gate electrodes 28 and the like are formed on these active regions $C_n$ and $C_p$ to form the above-described transistors $TR_{T1}$, $TR_{T2}$, $TR_{D1}$, $TR_{D2}$, $TR_{L1}$ and $TR_{L2}$.

As shown in dotted circles C1 in FIGS. 29 and 30, in this example, an n-type active region $C_n$ of the driver transistor $TR_{D1}$ and of the transfer transistor $TR_{T1}$ in one cell is divided by the device isolation insulating film 21, so that the n-type source/drain regions 36 of the transistors $TR_{D1}$ and $TR_{T1}$ are electrically connected with each other by the first conductive plug 47a. In addition, as shown in a dotted circle C2, as for the other pair of the driver transistor $TR_{D2}$ and the transfer transistor $TR_{T2}$, n-type source/drain regions 36 thereof are electrically connected with each other by the first conductive plug 47a.

Furthermore, the plural active regions $C_n$, which are divided as described above, are arranged so that longitudinal directions $D_2$ and $D_3$ of two regions $C_n$ of the plural active regions $C_n$ are orthogonal to each other.

(ii) Second Example

Figure 31:
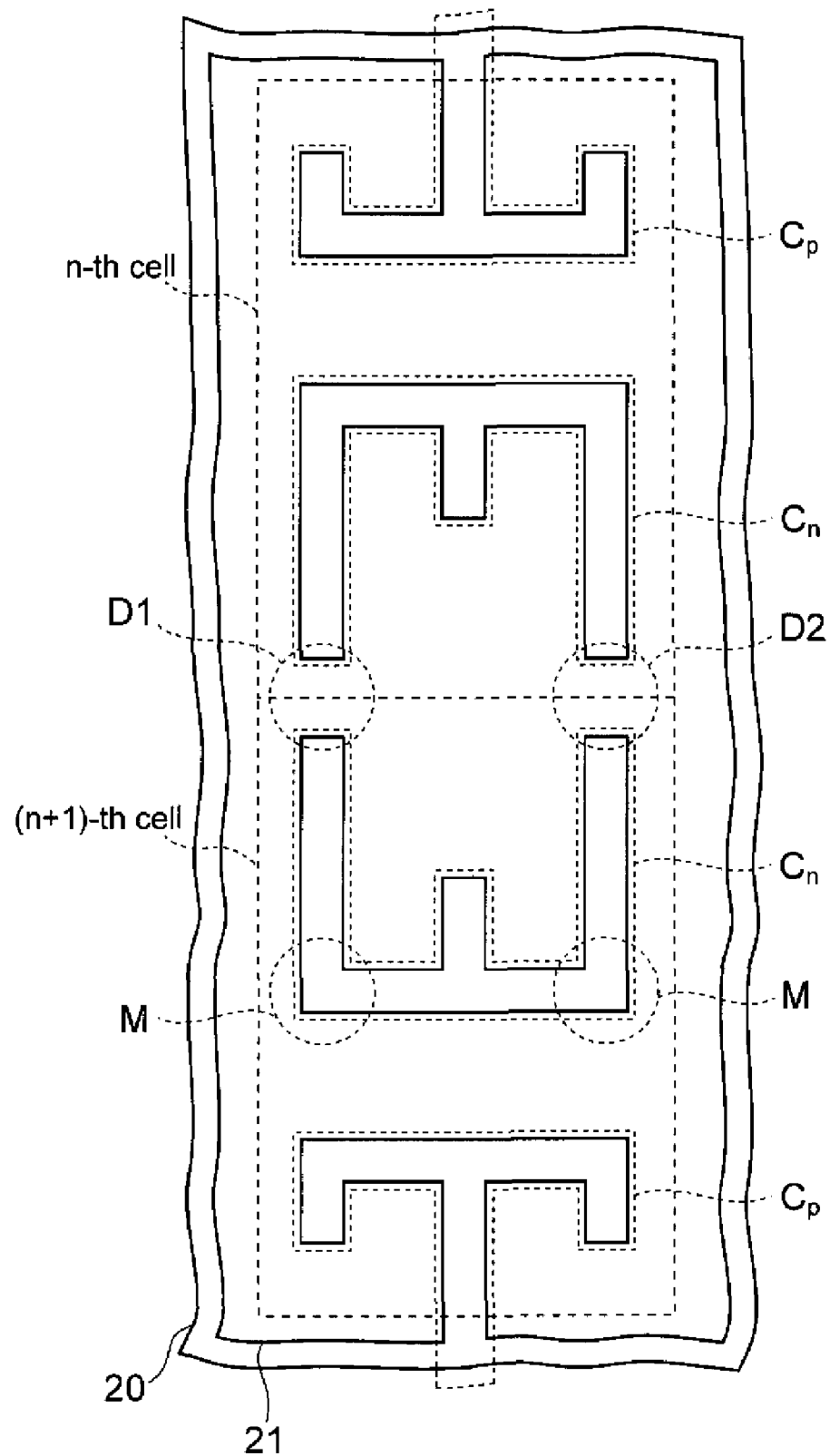
FIG. 31 is a view showing a plan layout of an active region of a semiconductor device (second example) according to the second embodiment.
Figure 32:
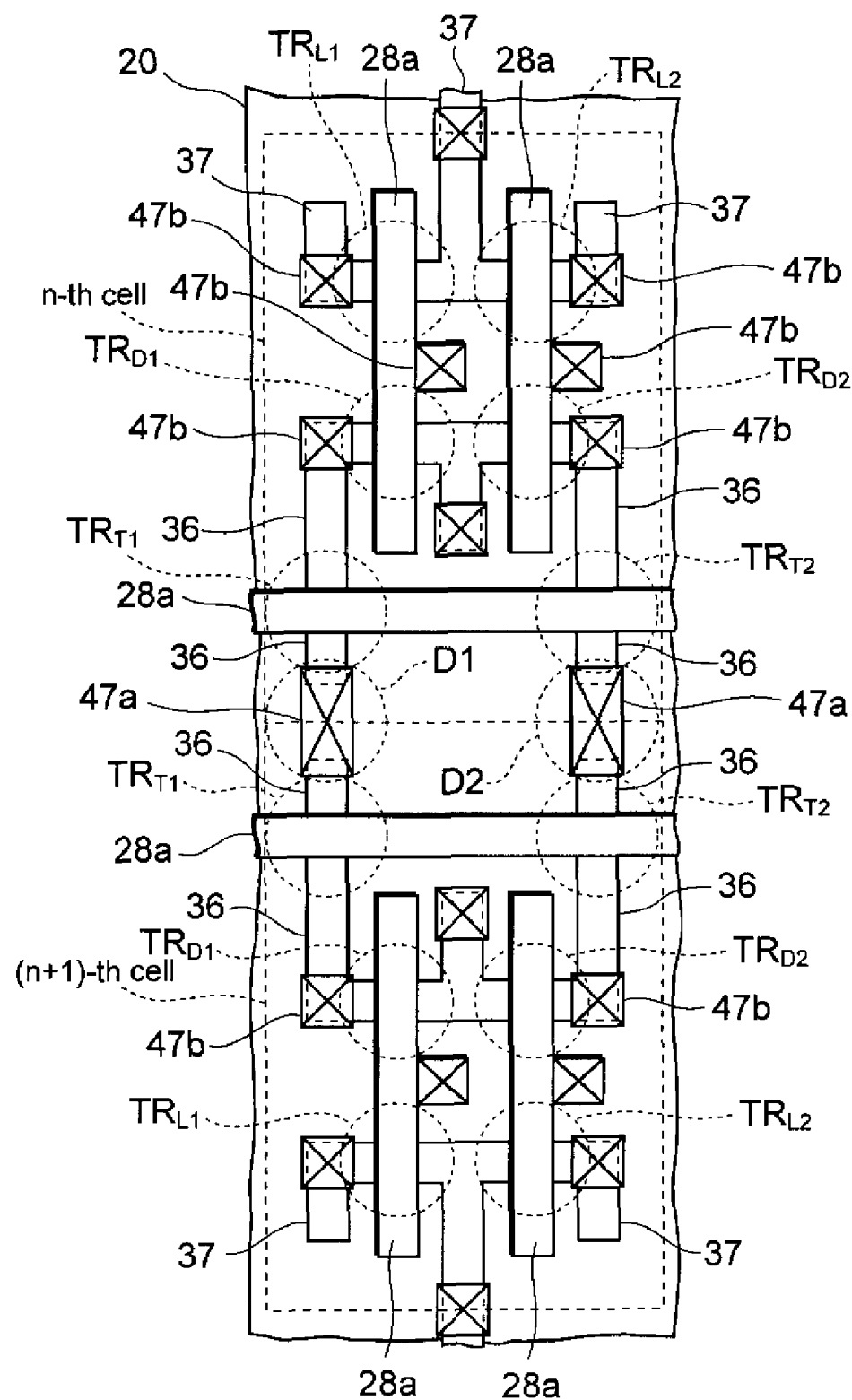
FIG. 32 is a plan view in a case where a gate electrode is formed on the active region of FIG. 31.

FIG. 31 is a view showing a plan layout of the active regions $C_n$ and $C_p$ of the bent-shaped SRAM according to the second example. FIG. 32 is a plan view showing a case where the gate electrodes 28a and the like are formed on these active regions $C_n$ and $C_p$ to form the transistors $TR_{T1}$, $TR_{T2}$, $TR_{D1}$, $TR_{D2}$, $TR_{L1}$ and $TR_{L2}$.

As shown by dotted circles D1 in FIGS. 31 and 32, in this example, the n-type active region $C_n$ is divided in a portion between adjacent cells by the device isolating insulating film 21. Then, as shown in FIG. 32, the n-type source/drain regions 36 of the transfer transistors $TR_{T1}$ of the adjacent cells are electrically connected with each other by the first conductive plug 47a. Furthermore, a transfer transistor $TR_{T2}$ other than $TR_{T1}$ also has a structure as shown in the dotted circle D2, in which the n-type source/drain regions 36 are electrically connected with each other by the first conductive plugs 47a.

Moreover, the divided source/drain regions 36 are arranged so as to be bent in portions shown by dotted circles M in FIG. 31.

(iii) Third Example

Figure 33:
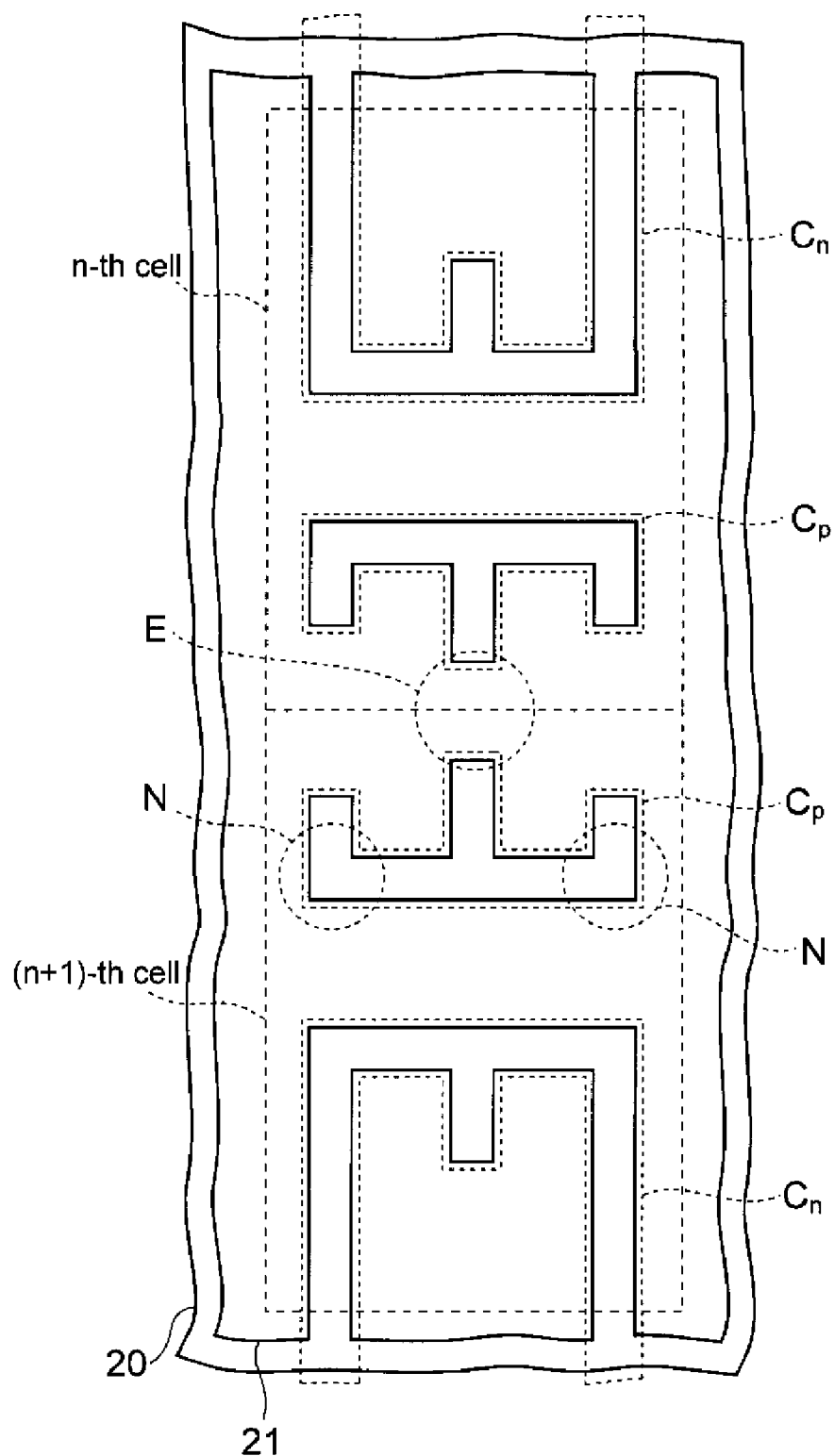
FIG. 33 is a view showing a plan layout of an active region of a semiconductor device (third example) according to the second embodiment.
Figure 34:
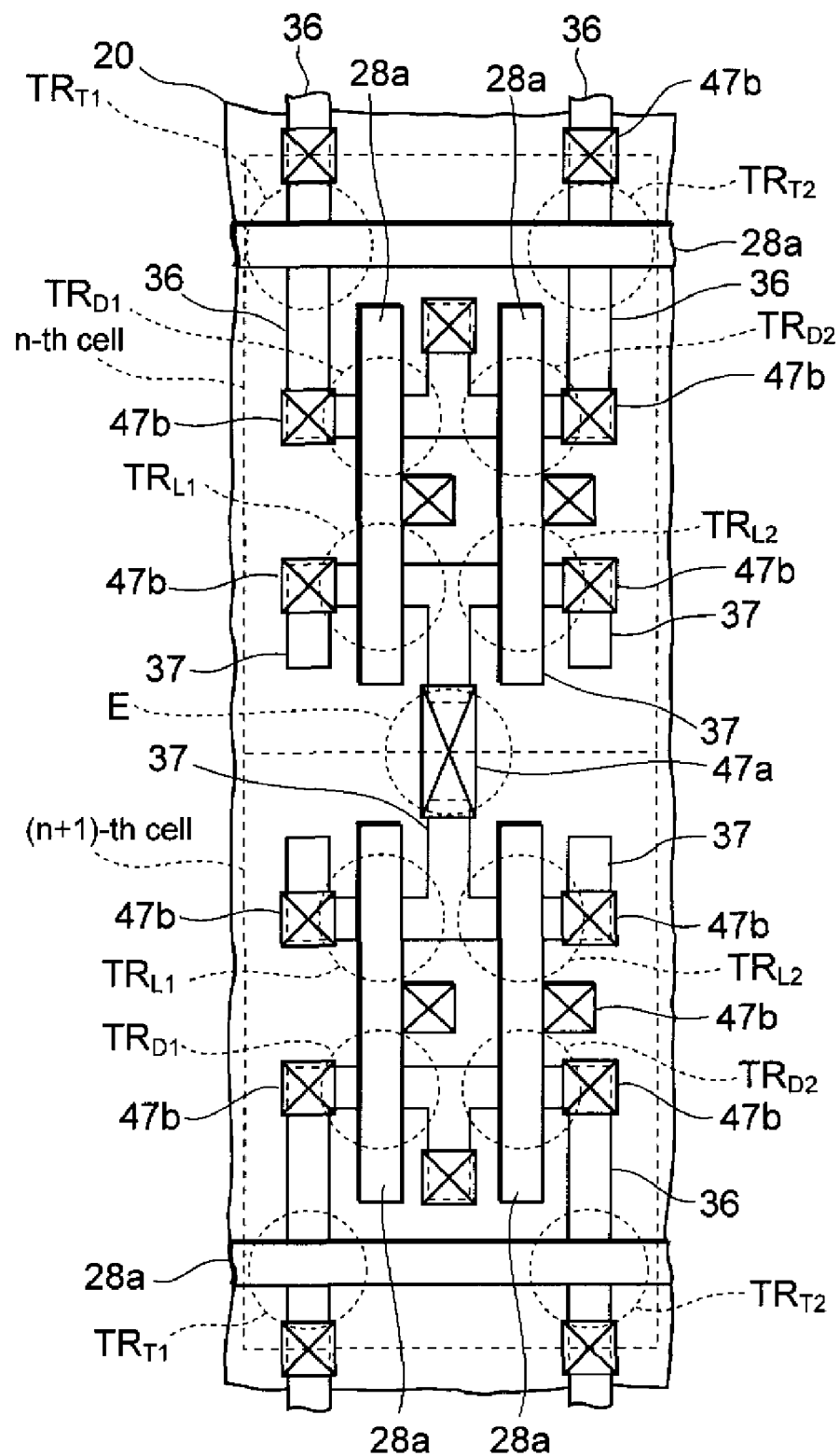
FIG. 34 is a plan view in a case where a gate electrode is formed on the active region of FIG. 33.

FIG. 33 is a view showing a plan layout of active regions $C_n$ and $C_p$ of a bent-shaped SRAM according to a third example. FIG. 34 is a plan view showing a case where gate electrodes 28a and the like are formed on these active regions $C_n$ and $C_p$ to form transistors $TR_{T1}$, $TR_{T2}$, $TR_{D1}$, $TR_{D2}$, $TR_{L1}$ and $TR_{L2}$ which constitute the SRAM.

As shown by dotted circles E in FIGS. 33 and 34, in the third example, the p-type active region $C_p$ is divided by the device isolation insulating film 21 in a portion between adjacent cells. Then, the first conductive plug 47a is formed so as to overlap with the divided p-type active regions $C_p$, so that the source/drain regions 36 of the load transistors $TR_{L1}$ and $TR_{L2}$ of the adjacent cells are electrically connected with each other by the first conductive plug 47a.

The divided p-type active region $C_p$ is arranged so as to be bent in portions shown by dotted circles N in FIG. 33, as similar to the case of the n-type active region $C_n$ of the second example.

(3) Third Embodiment

The inventors actually investigated the extent to which the leak current was reduced in the SRAMs as described in the first and second embodiments. The results of the investigation will be described below.

(i) Stand-by Leak Current

First, in order to investigate the extent to which the leak current is reduced by dividing the active regions $C_n$ and $C_p$, a stand-by leak current in a stand-by state, that is, at the time when all the transistors constituting one cell are in an off-state, was actually measured for each of the cases of the conventional stripe-shaped SRAM (see, FIG. 2), the first stripe-shaped SRAM of the first embodiment (see, FIG. 25), and the second stripe-shaped SRAM of the first embodiment (see, FIG. 28). The results thereof are shown in FIG. 35.

Note that in this investigation, a million cells were integrally formed on a silicon substrate, and a leak current of entire cells was investigated. In addition, the longitudinal axis of the graph in FIG. 35 shows a ratio of leak current of the first embodiment to the leak current of the conventional example.

Figure 35:
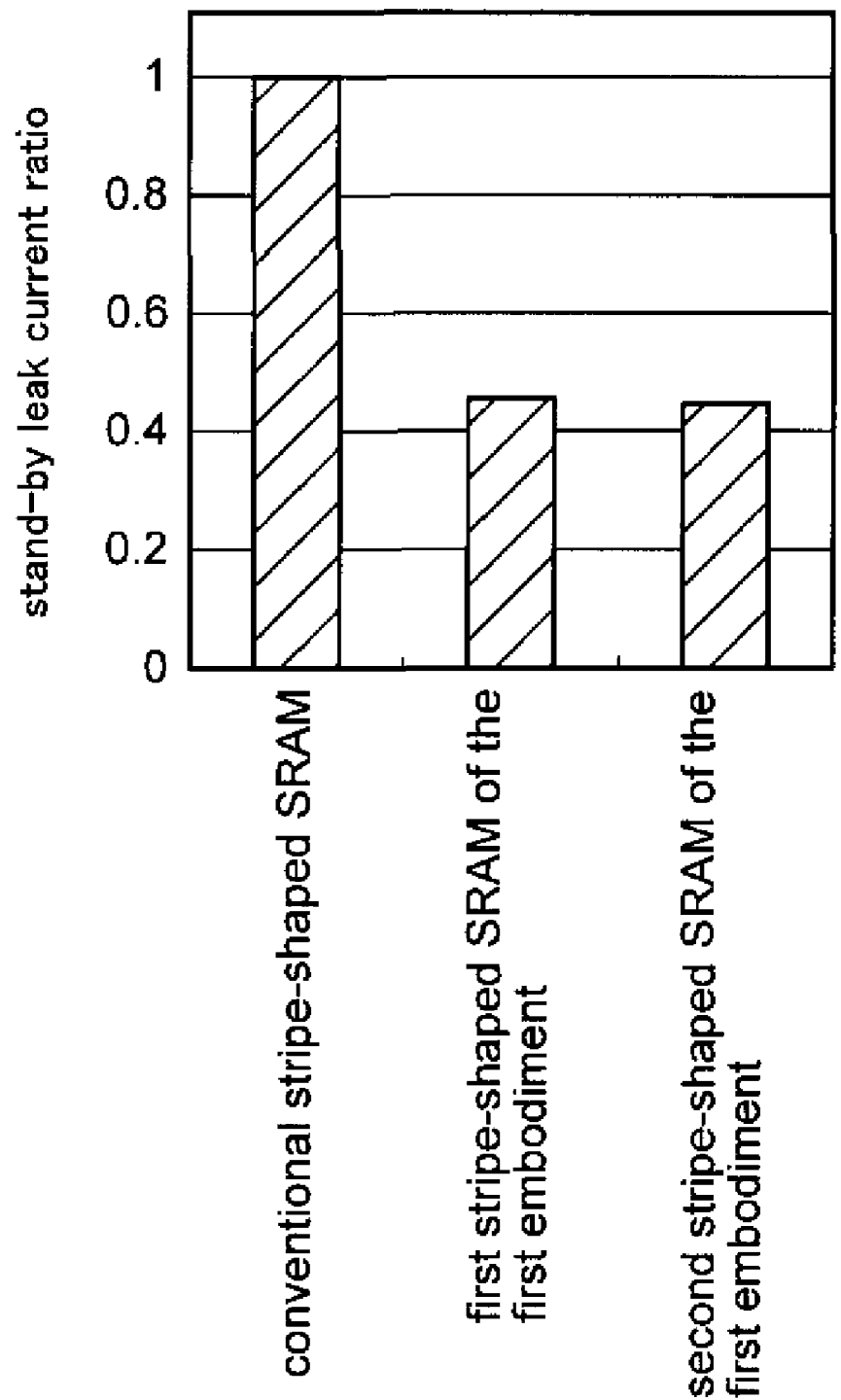
FIG. 35 is a graph obtained by investigating a stand-by leak current of each of the semiconductor devices according to the conventional embodiment and the first embodiment.

As is clear from FIG. 35, compared with the conventional example, the leak current of the first stripe-shaped SRAM was reduced to as much as approximately 65%, and the leak current of the second stripe-shaped SRAM was reduced to as much as approximately 67%.

Figure 4:
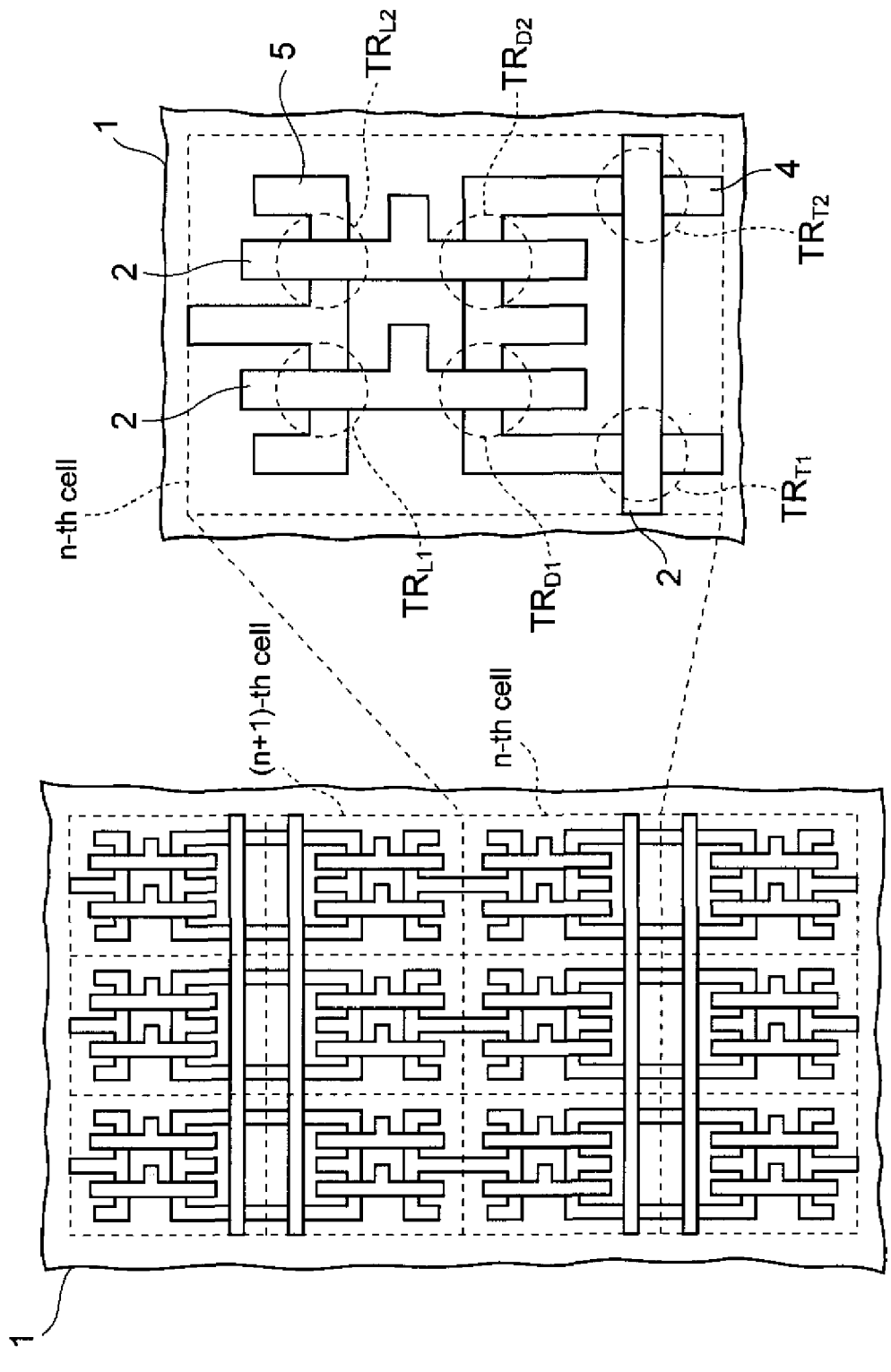
FIG. 4 is a plan view of a bent-shaped SRAM according to a conventional embodiment.
Figure 36:
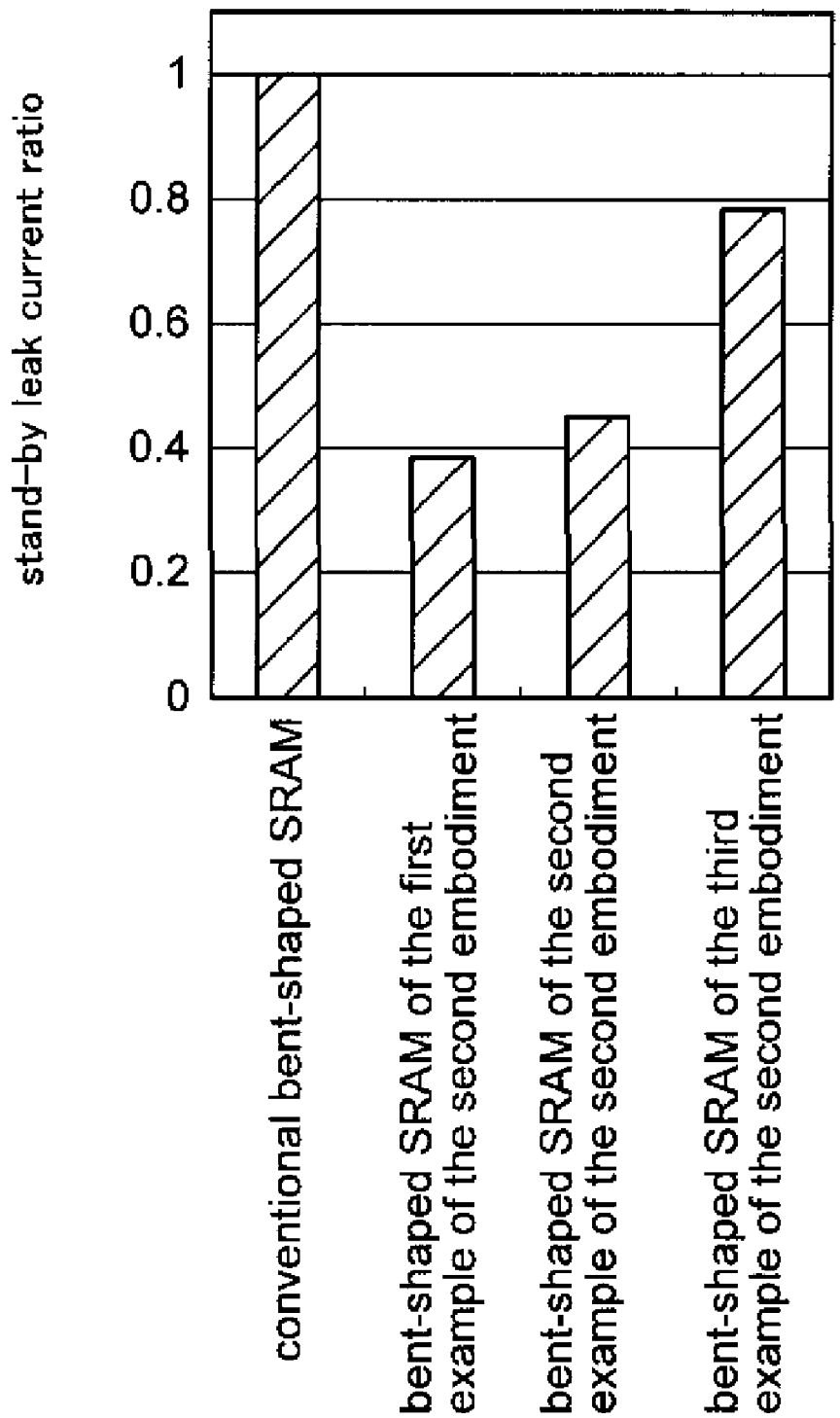
FIG. 36 is a graph obtained by investigating a stand-by leak current of each of the semiconductor devices according the conventional embodiment and the second embodiment.

FIG. 36 is a graph obtained by investigating the leak currents, in the same way as in FIG. 35, of the conventional bent-shaped SRAM (see, FIG. 4) and the bent-shaped SRAMs according to the first to third examples of the second embodiment (see, FIGS. 30, 32 and 34). Note that the longitudinal axis in FIG. 36 shows a ratio of each of the leak currents of the first to third examples of the second embodiment to that of the conventional example.

As shown in FIG. 36, compared with the conventional example, the leak current of the bent-shaped SRAM of the first example of the second embodiment was reduced to approximately 62%. The leak current of the second example was reduced to approximately 65%, and the leak current of the third example was reduced to approximately 22%. Note that in the bent-shaped SRAM of the third example, the ratio of the reduced leak current is smaller than those of the first and second examples. This is because in the third example (see, FIG. 34), the active region $C_p$ of a p-type MOS transistor originally having a smaller leak current than an n-type MOS transistor, is divided. Furthermore, a ratio of the leak current of the load transistors $TR_{L1}$ and $TR_{L2}$ which are formed of the p-type MOS transistor to the entire leak current is small.

From the results shown in FIGS. 35 and 36, it was made clear that the leak currents of SRAMs in a stand-by state could be actually reduced by dividing the active regions $C_p$ and $C_n$.

(ii) Substrate Leak Current

Figure 37:
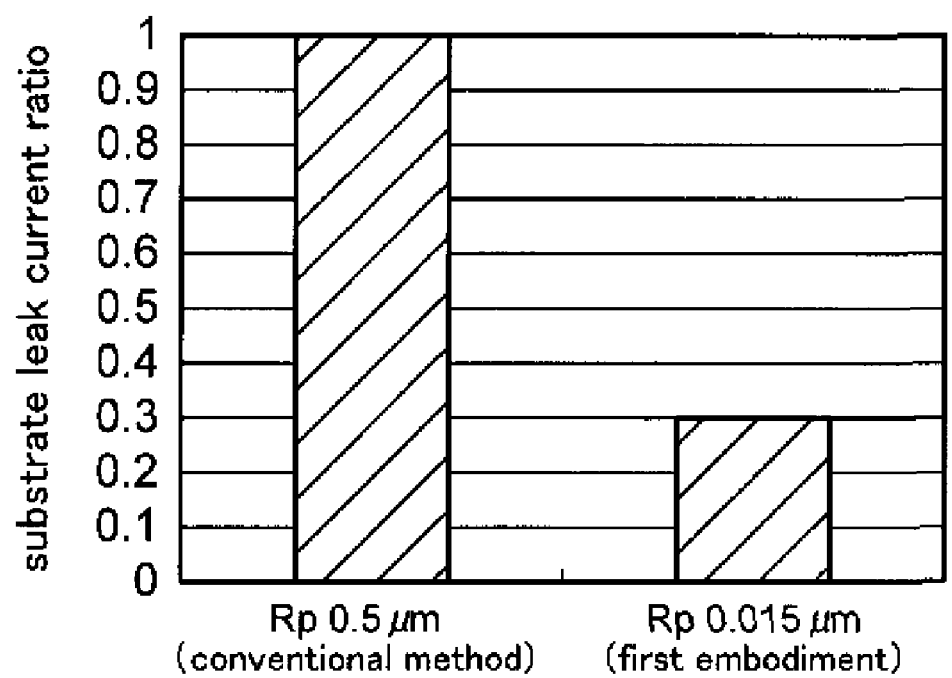
FIG. 37 is a graph obtained by investigating a substrate leak current of each of the semiconductor devices of the conventional embodiment and the first embodiment.
Figure 38:
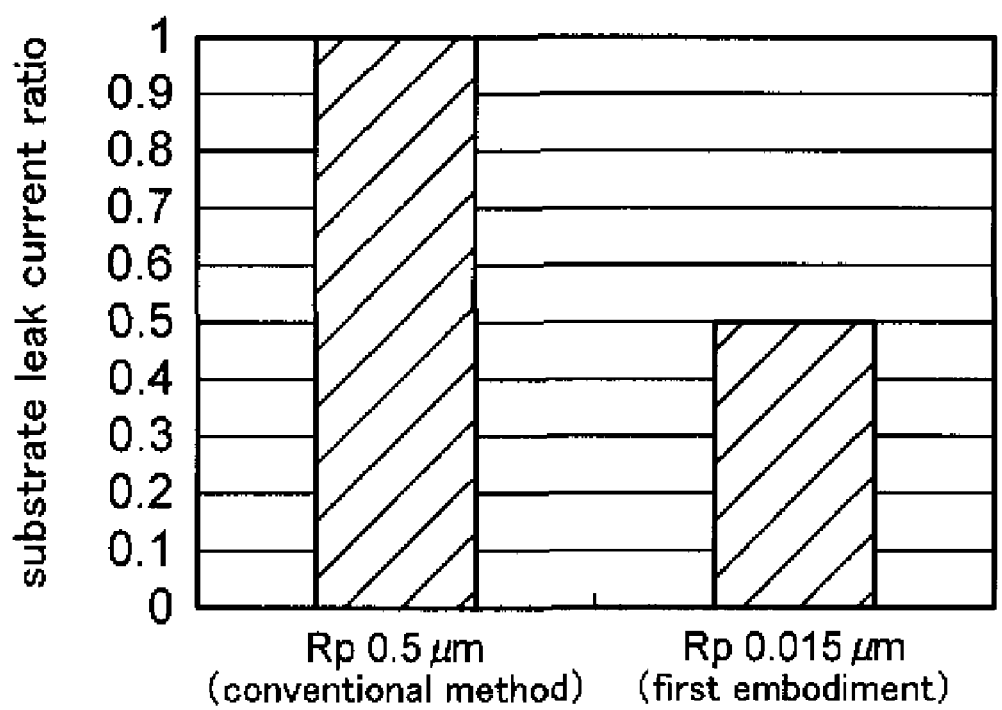
FIG. 38 is a graph obtained by investigating a substrate leak current of each of the semiconductor devices according to the conventional embodiment and the second embodiment.

Next, as described in FIG. 26, investigation was made on the extent to which the leak current flowing to the silicon substrate 20 from the first conductive plug 47a was reduced by setting the peak depth Rp of the impurity concentration in the p-type channel region 24 to be as shallow as 0.015 μm or less. The results thereof are shown in FIGS. 37 and 38. Note that in this investigation, a million cells were integrally formed on a silicon substrate, and a substrate current of entire cells was investigated.

FIG. 37 is a graph obtained by investigating each of the substrate leak currents of the conventional stripe-shaped SRAM (see, FIG. 2) and the first stripe-shaped SRAM of the first embodiment (see, FIG. 25). In the conventional stripe-shaped SRAM, the peak depth Rp of the impurity concentration in the channel region was set to 0.5 μm which is deeper than that of the first embodiment.

As is clear from FIG. 37, in the first embodiment, the substrate leak current was reduced to as much as approximately 70% as compared with the conventional example. Thus, it is understood that setting the peak depth Rp of the impurity concentration in the p-type channel region 24 to be as shallow as 0.015 μm or less is significantly effective for reducing the substrate leak current.

In contrast, FIG. 38 is a graph obtained by investigating each of the substrate leak currents of the conventional bent-shaped SRAM (see, FIG. 4) and the bent-shaped SRAM of the first example of the second embodiment (see, FIG. 30). In this investigation, similar to the investigation of FIG. 37, the peak depth Rp of the impurity concentration in the p-type channel region of the bent-shaped SRAM of the second embodiment was set to 0.015 μm, and the peak depth Rp of the conventional example was set to 0.5 μm.

As shown in FIG. 38, even in the case of the bent-shaped SRAM, the leak current is reduced as much as approximately 50% as compared with that of the conventional example.

From the results of FIGS. 37 and 38, it was made clear that a SRAM with a reduced substrate leak current could be provided regardless of types of SRAMs, such as a stripe-shaped or a bent-shaped SRAM, by setting the peak depth Rp of the impurity concentration in the p-type channel region to be as shallow as 0.015 μm.

(4) Fourth Embodiment

In the above-described first to third embodiments, the active regions $C_p$ and $C_n$ which constitute the SRAM are divided to reduce the stand-by leak current of the SRAM in a stand-by state. In the present embodiment, another configuration is adopted to reduce the stand-by leak current.

Figure 39:
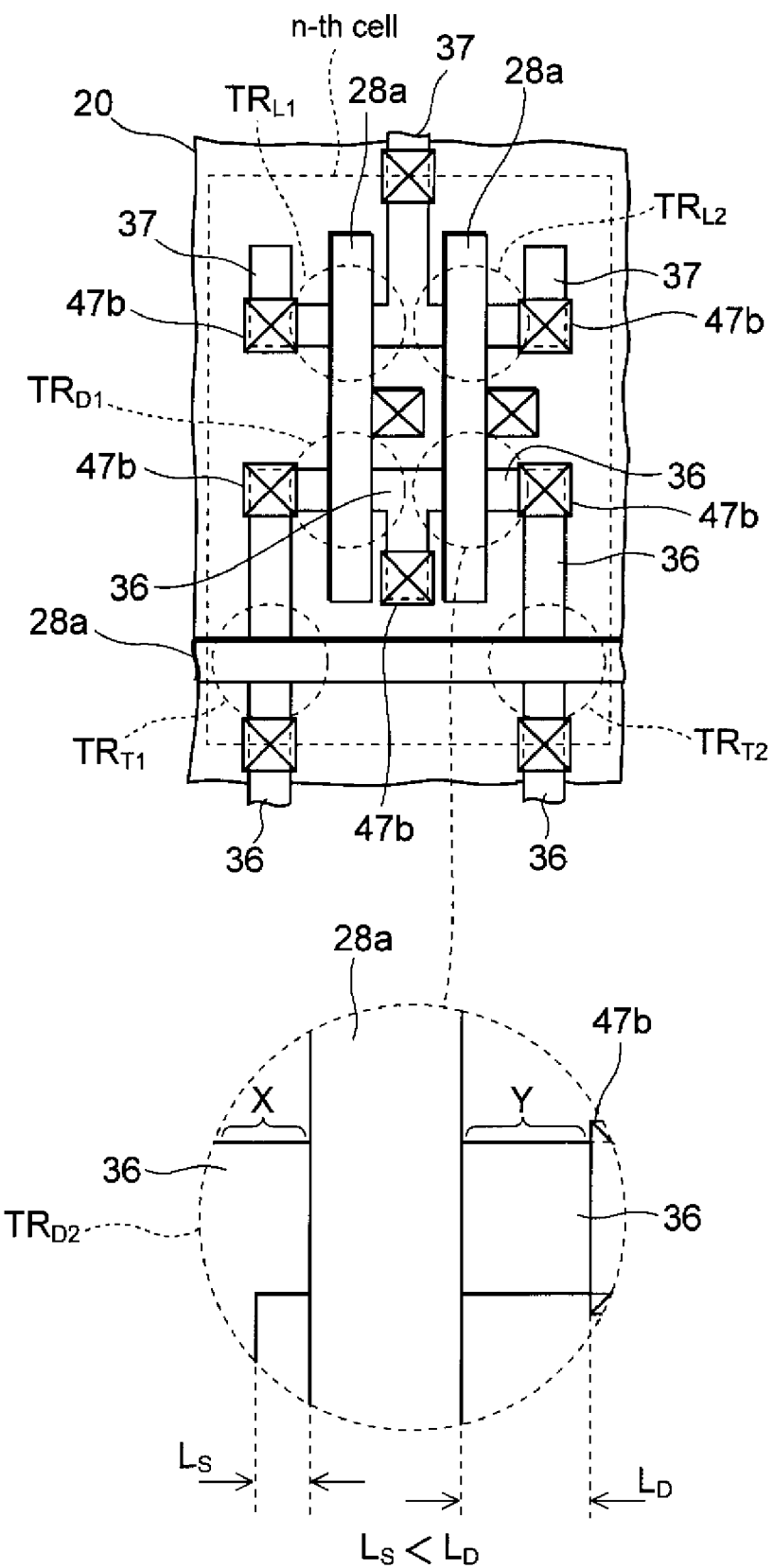
FIG. 39 is a plan view of a semiconductor device according to a fourth embodiment.

FIG. 39 is a plan view of a semiconductor device according to the present embodiment. Note that in FIG. 39, the same reference numerals are given to the same components as those of the first to third embodiments, and the description thereof will be omitted.

As shown in FIG. 39, the semiconductor device according to the present embodiment is a bent-shaped SRAM. In the present embodiment, gate electrodes 28a are sifted toward X of a region functioning as a source of source/drain regions 36 which constitute driver transistors $TR_{D1}$ and $TR_{D2}$. With this, there can be obtained a structure that a length $L_S$ in a gate length direction of the source/drain region 36 functioning as the source is shorter than a length $L_D$ in a gate length direction of the source/drain region 36 functioning as a drain.

Figure 40:
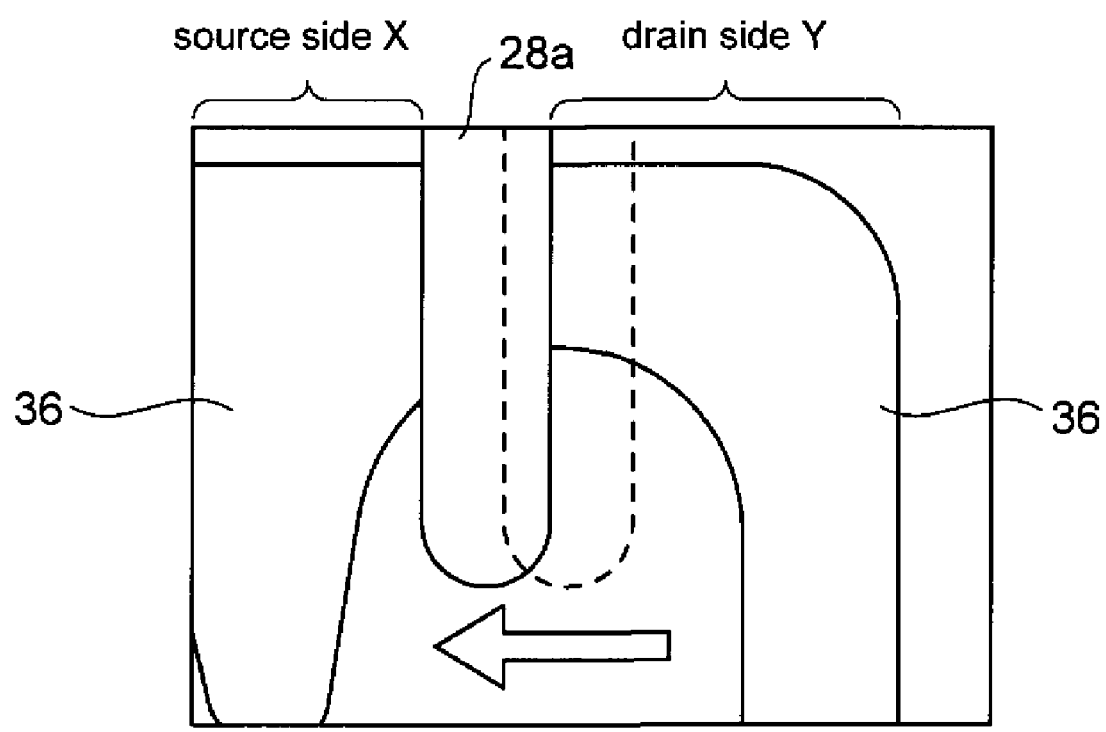
FIG. 40 is a view depicted based on a SEM image of the semiconductor device according to the fourth embodiment.

FIG. 40 is a view depicted based on a SEM (scanning electron microscope) image of such an SRAM.

Figure 41:
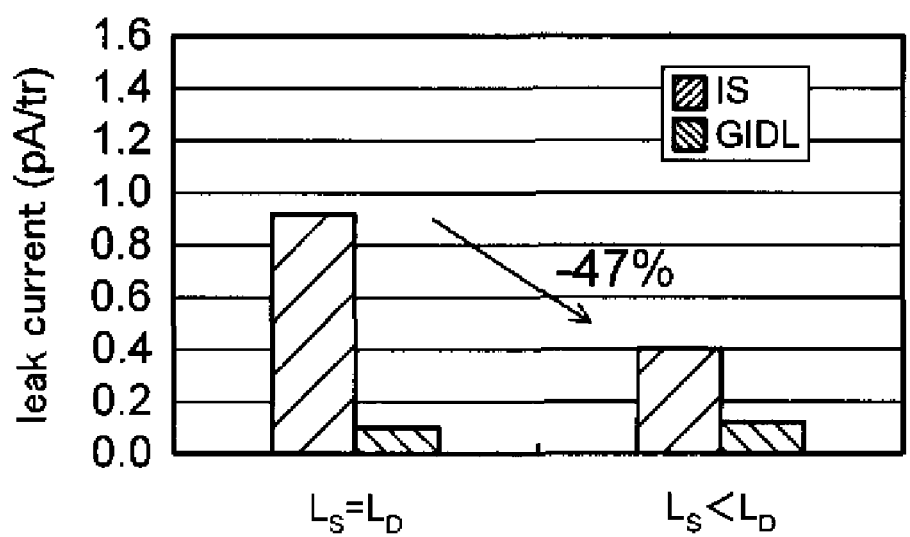
FIG. 41 is a graph obtained by investigating a leak current of each of the semiconductor devices according to the conventional embodiment and the fourth embodiment.

The inventors investigated on what kind of effects on a leak current of SRAM was seen by sifting the gate electrodes 28a to the source side X as described above. FIG. 41 shows the results thereof. Note that in FIG. 41, IS means a sub-threshold leak current flowing between the source and the drain, and that GIDL is an abbreviation of gate induced drain leakage, which is a leak current flowing from the drain to the silicon substrate 20. In addition, the longitudinal axis in FIG. 41 shows a leak current per transistor.

Then, in FIG. 41, a leak current generated when the length $L_S$ of the source and the length $L_D$ of the drain are set to be equal ($L_S=L_D$) is also shown for comparison purpose.

As shown in FIG. 41, it is clear that the sub-threshold leak current IS was reduced as much as approximately 47% by moving the gate electrodes 28a to the source side ($L_S<L_D$) as compared with the case where the gate electrodes 28a were not sifted.

In FIG. 41, the investigation was carried out for the driver transistors $TR_{D1}$ and $TR_{D2}$. However, according to another investigation that the inventors carried out, it was made clear that the leak current could be reduced even in the load transistors $TR_{L1}$ and $TR_{L2}$.

Furthermore, although the bent-shaped SRAM was described in the foregoing, it is also expected that the leak current can be reduced by shifting the gate electrodes 28a to the source side.

What is claimed is:

1. A semiconductor device comprising:
   a semiconductor substrate;
   a device isolation insulating film dividing an active region of the semiconductor substrate into plural pieces;
   a gate electrode formed on the active region with a gate insulating film interposed therebetween;
   a source/drain region which is formed in the active region on both sides of the gate electrode, and which constitutes a MOS transistor of a memory cell with the gate electrode;
   an interlayer insulating film formed over each of the active region and the device isolation insulating film;
   a hole which is formed in the interlayer insulating film, and which commonly overlaps with two adjacent active regions and the device isolation insulting film between the two active regions; and
   a conductive plug which is formed in the hole, and which electrically connects the two active regions
   wherein a plurality of the MOS transistors are formed,
   at least two of the plural MOS transistors are a driver transistor and a transfer transistor, and
   the active regions of the adjacent driver transistor and transfer transistor are electrically connected with each other by the conductive plug.

2. The semiconductor device according to claim 1, wherein the plurally divided active regions are arranged to form lines in a stripe shape in longitudinal directions of the active regions.

3. The semiconductor device according to claim 1, wherein longitudinal directions of at least two of the active regions of the plurally divided active regions are orthogonal to each other.

4. The semiconductor device according to claim 1, wherein at least one of the plurally divided active regions is bent.

5. The semiconductor device according to claim 1, wherein a part of a bottom edge of the conductive plug is embedded in the device isolation insulating film, and a junction depth of the source/drain region is set to be deeper than a depth of the embedded depth.

6. The semiconductor device according to claim 5, wherein a peak depth of impurity concentration in a channel region of the MOS transistor is shallower than 0.015 μm.

7. The semiconductor device according to claim 1, wherein the memory cell is an SRAM (static random access memory) memory cell.

8. A semiconductor device comprising:
   a semiconductor substrate having an active region;
   a gate electrode formed on the active region with a gate insulating film interposed therebetween; and
   a source/drain region which is formed in the active region on both sides of the gate electrode, and which constitutes a MOS transistor of a memory cell with the gate electrode,
   wherein the gate electrode is sifted to a region that functions as a source of the source/drain region, whereby a length in a gate length direction of the region is made shorter than a length in a gate length direction of a region functioning as a drain of the source/drain region.

9. The semiconductor device according to claim 8, wherein the memory cell is an SRAM memory cell.

10. A method for manufacturing a semiconductor device comprising the steps of:
    forming a device isolation insulating film on a semiconductor substrate and dividing an active region of the semiconductor substrate into plural pieces by the device isolation insulating film;
    forming a channel region by implanting first impurities into the semiconductor substrate of the active region;
    forming a gate electrode on the semiconductor substrate of the active region with a gate insulating film interposed therebetween;
    forming a source/drain region by implanting second impurities into the silicon substrate on both sides of the gate electrode and thereby forming a MOS transistor of a memory cell constructed from the source/drain region and the gate electrode;
    forming an interlayer insulating film over the device isolation insulating film and the source/drain region;
    forming a hole in the interlayer insulating film, the hole commonly overlapping with the two adjacent active regions and the device isolation insulating film between the two active regions; and
    forming a conductive plug in the hole, the conductive plug electrically connecting the two active regions.

11. The method for manufacturing a semiconductor device according to claim 10, further comprising a step of:
    activating the second impurities by annealing the semiconductor substrate after forming the source/drain region.

12. The method for manufacturing a semiconductor device according to claim 10, further comprising a step of:
    forming a channel region in the silicon substrate in the active region so that the peak depth of impurity concentration become shallower than 0.015 μm.

13. The method for manufacturing a semiconductor device according to claim 10, wherein the memory cell is an SRAM memory cell.

14. A semiconductor device comprising:
    a semiconductor substrate;
    a device isolation insulating film dividing an active region of the semiconductor substrate into plural pieces;
    a gate electrode formed on the active region with a gate insulating film interposed therebetween;
    a source/drain region which is formed in the active region on both sides of the gate electrode, and which constitutes a MOS transistor of a memory cell with the gate electrode;

an interlayer insulating film formed over each of the active region and the device isolation insulating film;
a hole which is formed in the interlayer insulating film, and which commonly overlaps with two adjacent active regions and the device isolation insulting film between the two active regions; and
a conductive plug which is formed in the hole, and which electrically connects the two active regions,
wherein a plurality of the MOS transistors are formed,
at least two of the plural MOS transistors are transfer transistors, and
the active regions of the adjacent two transfer transistors are electrically connected with each other by the conductive plug.

* * * * *